United States Patent
Van Duren et al.

(10) Patent No.: US 8,961,814 B2
(45) Date of Patent: Feb. 24, 2015

(54) HIGH-SELECTIVITY WET PATTERNING OF SOURCE-DRAIN ELECTRODES OVER TAOS FOR A BCE DEVICE STRUCTURE

(71) Applicant: Intermolecular Inc., San Jose, CA (US)

(72) Inventors: Jeroen Van Duren, Palo Alto, CA (US); Zhi-Wen Wen Sun, Sunnyvale, CA (US)

(73) Assignee: Intermolecular, Inc., San Jose, CA (US)

( * ) Notice: Subject to any disclaimer, the term of this patent is extended or adjusted under 35 U.S.C. 154(b) by 0 days.

(21) Appl. No.: 14/132,383

(22) Filed: Dec. 18, 2013

(65) Prior Publication Data

US 2014/0264155 A1    Sep. 18, 2014

Related U.S. Application Data

(60) Provisional application No. 61/778,986, filed on Mar. 13, 2013.

(51) Int. Cl.
| | |
|---|---|
| *C09K 13/00* | (2006.01) |
| *C09K 13/04* | (2006.01) |
| *C09K 13/08* | (2006.01) |
| *C09K 13/06* | (2006.01) |
| *C09K 13/02* | (2006.01) |
| *H01L 21/306* | (2006.01) |
| *H01L 27/12* | (2006.01) |
| *H01L 21/02* | (2006.01) |
| *H01L 29/66* | (2006.01) |
| *H01L 29/786* | (2006.01) |

(Continued)

(52) U.S. Cl.
CPC ...... *H01L 21/30604* (2013.01); *H01L 27/1225* (2013.01); *H01L 21/02565* (2013.01); *H01L 21/02631* (2013.01); *H01L 29/66969* (2013.01); *H01L 29/7869* (2013.01); *H01L 21/465* (2013.01); *H01L 21/707* (2013.01)
USPC ....... 252/79.1; 252/79.2; 252/79.3; 252/79.4; 252/79.5; 438/745; 438/754

(58) Field of Classification Search
CPC ................... H01L 21/32134; H01L 21/02068; H01L 28/92; C23C 1/18; C23C 1/26; C23C 1/30; C23C 1/44; C23C 3/06; C23C 1/14; C23C 1/20; C23C 1/10; C23C 1/16; C23C 1/28; C23C 3/04
See application file for complete search history.

(56) References Cited

U.S. PATENT DOCUMENTS 7,439,087 B2    10/2008    Ishikawa
7,682,882 B2    3/2010    Ryu
(Continued)

OTHER PUBLICATIONS

Jae-Kwan Kim et al.; Wet Chemical Etching of ZnContaining Oxide and HfO2 Films; ; Journal of the Electrochemical Society; Unknown.
(Continued)

*Primary Examiner* — Duy Deo

(57) ABSTRACT

Methods and formulations for the selective etching of etch stop layers deposited above metal-based semiconductor layers used in the manufacture of TFT-based display devices are presented. The formulations are based on an alkaline solution. Methods and formulations for the selective etching of molybdenum-based and/or copper-based source/drain electrode layers deposited above metal-based semiconductor layers used in the manufacture of TFT-based display devices are presented. The formulations are based on an alkaline solution.

19 Claims, 5 Drawing Sheets

| ID | Acid/Base | Oxidizer | pH | Incubation | Mo Etch Rate | IGZO Etch Rate |
|---|---|---|---|---|---|---|
| 1 | CH3COOH | HNO3 | <1 | 25 sec | 24 A/s | 70 A/s |
| 2 | NH4OH | H2O2 | 12-14 | 15 sec | 67 A/s | 0 A/s |
| 3 | H2SO4 | HNO3 | <1 | 10 sec | 45 A/s | 160 A/s |
| 4 | HCl | H2O2 | <1 | 20 sec | 17 A/s | 82 A/s |

(51) Int. Cl.
*H01L 21/465* (2006.01)
*H01L 21/70* (2006.01)

(56) References Cited

U.S. PATENT DOCUMENTS 7,696,088 B2 4/2010 Long
8,193,531 B2 6/2012 Ishikawa

2008/0230393 A1* 9/2008 Okazaki et al. ............... 205/123
2009/0261291 A1* 10/2009 Banerjee et al. ............. 252/79.1
2010/0127257 A1 5/2010 Ryu

OTHER PUBLICATIONS

Chi-Yuan Lee et al.; Wet Etching Rates of InGaZnO for the Fabrication of Transparent ThinFilm Transistors on Plastic Substrates; ; Elsevier Sequoia; Unknown.

* cited by examiner

| ID | Acid/Base | Oxidizer | pH | Incubation | Mo Etch Rate | IGZO Etch Rate |
|---|---|---|---|---|---|---|
| 1 | CH3COOH | HNO3 | <1 | 25 sec | 24 A/s | 70 A/s |
| 2 | NH4OH | H2O2 | 12-14 | 15 sec | 67 A/s | 0 A/s |
| 3 | H2SO4 | HNO3 | <1 | 10 sec | 45 A/s | 160 A/s |
| 4 | HCl | H2O2 | <1 | 20 sec | 17 A/s | 82 A/s |

FIG. 5

HIGH-SELECTIVITY WET PATTERNING OF SOURCE-DRAIN ELECTRODES OVER TAOS FOR A BCE DEVICE STRUCTURE

CROSS-REFERENCE TO RELATED APPLICATIONS

This application claims priority to U.S. Provisional Application Ser. No. 61/778,986 filed on Mar. 13, 2013, which is herein incorporated by reference for all purposes.

TECHNICAL FIELD

The present disclosure relates generally to methods of employing selective wet etch formulations to pattern the source/drain electrodes for use in thin film transistors (TFTs) used in display applications.

BACKGROUND

TFTs are employed as switching and/or driving devices in many electronic circuits. As an example, TFTs are used as control devices for pixels in display applications such as flat panel displays (FPD), whether based on active-matrix-liquid-crystal displays (AMLCD), or active-matrix-organic-light-emitting-displays (AMOLED). These FPD are used in televisions, computer monitors, smart phones, tablets, etc. Traditionally, TFTs based on amorphous silicon technology (a-Si) have been used due to the low cost and ease of manufacture. However, a-Si-based TFTs have a number of issues such as low mobility, low ON/OFF current ratios (e.g. higher power), and limited durability. Additionally, TFTs based on a-Si are not transparent, thereby limiting the size of the TFT within the pixel so that the display characteristics are not compromised. With the market moving to higher resolution, higher refresh rate, lower power consumption, lower cost, larger displays, smaller bezel size, higher touch quality, higher image quality, and new applications (e.g. flexible displays) there is a need to replace a-Si.

Metal-based semiconductor materials (e.g. metal oxides, metal oxy-nitrides, metal oxy-chalcogenides, metal chalcogenides) are candidates for replacing a-Si in display applications. The metal-based semiconductor materials may be amorphous, crystalline, or polycrystalline. Some examples of metal-based semiconductor materials include those based on In—Ga—Zn—O (IGZO) and related materials, like In—Zn—O (IZO), In—Ga—O (IGO), Zn—Sn—O (ZTO), In—Sn—Zn—O (ITZO), Hf—In—Zn—O (HIZO), and Al—Zn—Sn—O (AZTO). Some examples of metal oxynitrides include Zn—O—N (ZnON), In—O—N (InON), Sn—O—N (SnON). Examples of crystalline metal-based semiconductor materials include c-axis aligned crystalline (CAAC) materials like CAAC-IGZO, or polycrystalline materials like ZnO and In—Ga—O (IGO). In addition to the application of these materials into TFTs, these materials are also being considered for memory (e.g. non-volatile random access memory (RAM)), sensor applications (e.g. image sensors), and central processing units (CPU). Some of these materials exhibit stable amorphous phases, high mobility (e.g. >5 cm$^2$/Vs), low threshold voltage (close to zero, e.g. in a range of −1.0V to +2.0V), low carrier concentrations (e.g. $10^{16}$-$10^{17}$ cm$^{-3}$), high ON/OFF current ratios (e.g. >$10^6$), and high durability (e.g. negative bias temperature illumination stress NBTIS with threshold voltage shift in a range of −1.5V to +0.5V). However, since these materials are multinary compounds (e.g. three or more elements), their performance and properties are sensitive to factors such as composition, concentration gradients, deposition parameters, post-deposition treatments, interactions with adjacent materials, and the like. Further, since the electrical, physical, and chemical behavior of these materials is difficult or impossible to model, much of the development and optimization must be accomplished empirically. Comprehensive evaluation of the entire composition range and deposition parameter space for the formation of a TFT device utilizing these materials requires thousands or millions of experiments.

The traditional film stack for a metal-based semiconductor TFT requires an etch stop layer to protect the metal-based semiconductor material during the patterning of the source and drain electrodes. If an etch process can be developed that does not degrade the metal-based semiconductor material performance, the number of processing steps and the cost of manufacture of the TFT device can be reduced because the etch stop layer deposition and patterning can be avoided. Furthermore, back-channel-etch (BCE) devices (no etch stopper) can be made smaller than etch-stopper-based devices, and parasitic capacitance can be reduced, both improving display performance.

SUMMARY

The following summary of the disclosure is included in order to provide a basic understanding of some aspects and features of the invention. This summary is not an extensive overview of the invention and as such it is not intended to particularly identify key or critical elements of the invention or to delineate the scope of the invention. Its sole purpose is to present some concepts of the invention in a simplified form as a prelude to the more detailed description that is presented below.

In some embodiments, etch stop layers are selectively etched over a metal-based semiconductor layer during the manufacture of TFT display devices. The selective etch formulations include at least one or more of the following components for the selective etch of silicon oxide, silicon nitride, silicon oxy nitride, or silicon oxy nitride based etch stop layers over the metal-based semiconductor layer: an acid solution with a pH below 7.0, preferably in the range of 1.0 to 7.0, and even more preferred in the range of 3.0 to 7.0, pH buffer components to stabilize the pH (e.g. citric acid/sodium citrate, acetic acid/sodium acetate, or buffered oxide etch, being a mixture of $NH_4F$ and HF), fluoride-containing components (e.g. HF) to facilitate the etching of the etch stop material, selective complexing agents for $[SiF_6]^{2-}$ (e.g. cyclic compounds based on quarternary ammonium cations), surfactants bonding to the metal-based semiconductor surface preferentially over the etch stopper surface, and salts of the metals in the metal-based semiconductor with a low solubility (e.g. salts of In, Ga, and Zn in case of IGZO semiconductor, such as fluorides, carbonates, phosphates, borates, arsenates, arsenites, cyanides, ferricyanides, oxalates, sulfites, sulfides, chromates, and silicates) to retard the etching of the metal-based semiconductor material. The pH can be adjusted by using one or a mixture of more acids like hydrofluoric acid (HF) and other typical acids (e.g. hydrochloric acid (HCl), hydrobromic acid (HBr), sulfuric acid ($H_2SO_4$), nitric acid ($HNO_3$), phosphoric acid ($H_3PO_4$), organic acids, etc.). The fluoride-containing components can be introduced from HF or from soluble fluoride-containing reagents. This formulation will be effective at removing the etch stop layer and will effectively stop on the metal-based semiconductor material. Further, the etch formulation will not cause significant damage to the metal-based semiconductor material that cannot be repaired. Minor damage to the metal-based semiconductor layer can be recovered by a subsequent wet or dry surface treatment.

In some embodiments, molybdenum-based source/drain electrode layers are selectively etched over a metal-based semiconductor layer during the manufacture of TFT display devices. The wet etch formulations will include at least one or more of the following components: an alkaline solution with a pH in the range of 7.0 to 12.0, pH buffer components to stabilize the pH of the formulation (e.g. sodium carbonate/ sodium hydrogen carbonate, or buffers based on borates, or based on N-Cyclohexyl-2-aminoethanesulfonic acid, or buffers based on sodium hydroxide mixed with either sodium tetraborate, glycine, sodium bicarbonate, or sodium hydrogen orthophosphate), oxidizing components to facilitate the etching of the molybdenum-based source/drain electrode material (e.g. peroxides like hydrogen peroxide, or oxidizers like chlorates, perchlorates, and hexavalent chromium compounds), complexing agents that preferentially complex molybdenum-based ions over the metal-based ions of the metal-based semiconductor (e.g. cyclic compounds like crown ethers), surfactants bonding to the metal-based semiconductor surface preferentially over the source/drain electrode material, and salts of the metals of the metal-based semiconductor material with a low solubility (e.g. salts of In, Ga, and Zn in case of IGZO semiconductor, such as fluorides, carbonates, phosphates, borates, arsenates, arsenites, cyanides, ferricyanides, oxalates, sulfites, sulfides, chromates, and silicates) to retard the etching of the metal-based semiconductor material. The pH can be adjusted by using one or a mixture of more bases. Further, the etch formulation will not cause significant damage to the metal-based semiconductor material that cannot be repaired. Minor damage to the metal-based semiconductor layer can be recovered by a subsequent wet or dry surface treatment. One example of a wet etch formulation is an alkaline mixture of $NH_4OH$ and hydrogen peroxide.

In some embodiments, copper-based source/drain electrode layers are selectively etched over a metal-based semiconductor layer during the manufacture of TFT display devices. The wet etch formulations will include at least one or more of the following components: an acidic solution with a pH below 7.0, preferably in the range of 1.0 to 7.0, pH buffer components to stabilize the pH of the formulation (e.g. citric acid/sodium citrate, acetic acid/sodium acetate, or buffered oxide etch, being a mixture of $NH_4F$ and HF), complexing (chelating) agents that preferentially complex copper-based ions over the metal-based ions of the metal-based semiconductor (e.g. cyclic compounds like crown ethers, or compounds like lactic acid, citric acid, formic acid, tartaric acid, malonic acid, and phosponate compounds like etidronic acid, 1,2-diaminoethanetetrakismethylene phosphonic acid, nitrilotrismethylenephosphonic acid, or diethylenetriaminepentakismethylene phosphonic acid), surfactants bonding to the metal-based semiconductor surface preferentially over the source/drain electrode material, and salts of the metals of the metal-based semiconductor material components with a low solubility (e.g. salts of In, Ga, and Zn in case of IGZO semiconductor, such as fluorides, carbonates, phosphates, borates, arsenates, arsenites, cyanides, ferricyanides, oxalates, sulfites, sulfides, chromates, and silicates) to retard the etching of the metal-based semiconductor material. The pH can be adjusted by using one or a mixture of more acids like organic acids (e.g. lactic acid, citric acid, formic acid, tartaric acid, malonic acid, and phosponate compounds like etidronic acid, 1,2-diaminoethanetetrakismethylene phosphonic acid, nitrilotrismethylenephosphonic acid, or diethylenetriaminepentakismethylene phosphonic acid), or inorganic acids (e.g. hydrochloric acid (HCl), hydrobromic acid (HBr), sulfuric acid ($H_2SO_4$), nitric acid ($HNO_3$), phosphoric acid ($H_3PO_4$), etc.). Further, the etch formulation will not cause significant damage to the metal-based semiconductor material that cannot be repaired. Minor damage to the metal-based semiconductor layer can be recovered by a subsequent wet or dry surface treatment. One example of a wet etch formulation is a mixture of hydrogen peroxide with formic acid. Another example of a wet etch formulation is a mixture of hydrogen peroxide with lactic acid. Yet, another example of a wet etch formulation is a mixture of hydrogen peroxide with citric acid. Yet, another example of a wet etch formulation is a mixture of hydrogen peroxide with etidronic acid. Yet, another example of a wet etch formulation is a mixture of hydrogen peroxide with nitrilotrismethylenephosphonic acid.

BRIEF DESCRIPTION OF THE DRAWINGS

To facilitate understanding, identical reference numerals have been used, where possible, to designate identical elements that are common to the figures. The drawings are not to scale and the relative dimensions of various elements in the drawings are depicted schematically and not necessarily to scale.

The techniques of the present invention can readily be understood by considering the following detailed description in conjunction with the accompanying drawings, in which:

FIG. 5 is a table listing etch formulations for Mo-based source/drain electrode layers and etch rate data according to some embodiments.

DETAILED DESCRIPTION

Figure 1:
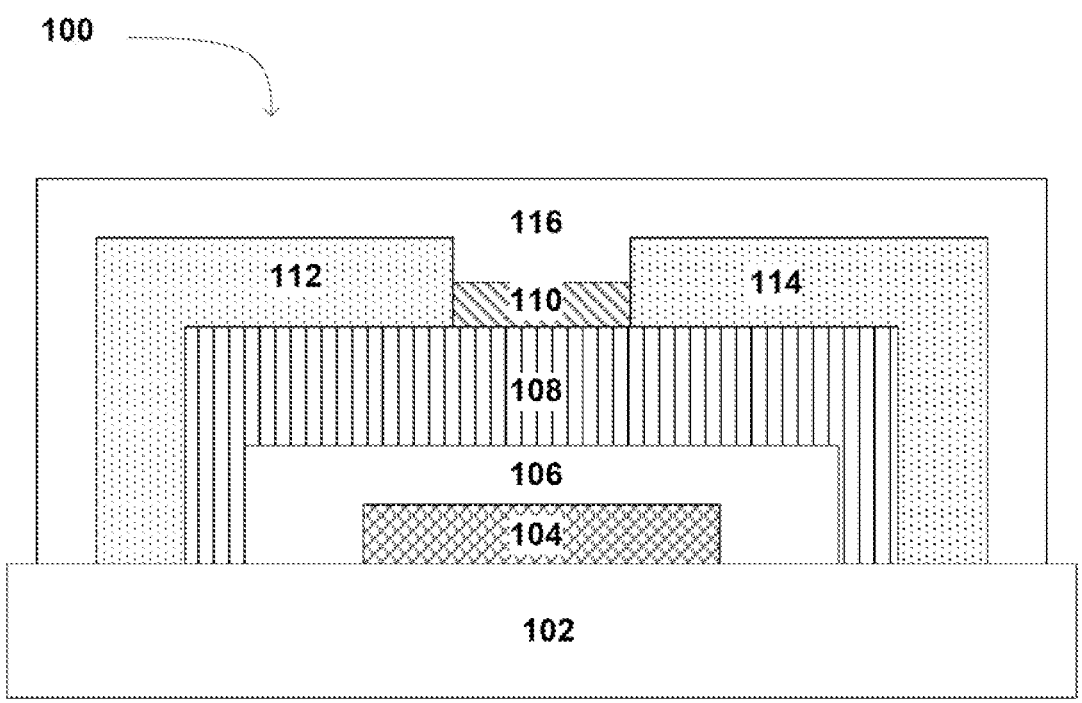
FIG. 1 is a simplified cross-sectional view of a TFT according to some embodiments.

A detailed description of one or more embodiments is provided below along with accompanying figures. The detailed description is provided in connection with such embodiments, but is not limited to any particular example. The scope is limited only by the claims and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

It must be noted that as used herein and in the claims, the singular forms "a," "an" and "the" include plural referents unless the context clearly dictates otherwise. Thus, for example, reference to "a layer" includes two or more layers, and so forth.

Where a range of values is provided, it is understood that each intervening value, to the tenth of the unit of the lower limit unless the context clearly dictates otherwise, between the upper and lower limit of that range, and any other stated or intervening value in that stated range, is encompassed within the invention. The upper and lower limits of these smaller ranges may independently be included in the smaller ranges, and are also encompassed within the invention, subject to any specifically excluded limit in the stated range. Where the stated range includes one or both of the limits, ranges excluding either or both of those included limits are also included in the invention. Where the modifier "about" or "approximately" is used, the stated quantity can vary by up to 10%. Where the modifier "substantially equal to" or "substantially the same" is used, the two quantities may vary from each other by no more than 5%.

The term "horizontal" as used herein will be understood to be defined as a plane parallel to the plane or surface of the substrate, regardless of the orientation of the substrate. The term "vertical" will refer to a direction perpendicular to the horizontal as previously defined. Terms such as "above", "below", "bottom", "top", "side" (e.g. sidewall), "higher", "lower", "upper", "over", and "under", are defined with respect to the horizontal plane. The term "on" means there is direct contact between the elements. The term "above" will allow for intervening elements.

As used herein, a material (e.g. a dielectric material or an electrode material) will be considered to be "crystalline" if it exhibits greater than or equal to 30% crystallinity (e.g by volume) as measured by a technique such as x-ray diffraction (XRD).

As used herein, the terms "buffer", "buffer solution" and "buffer components" will be understood to refer to solutions or components that comprise a mixture of a weak acid and its conjugate or a weak base and its conjugate. The pH of such mixtures changes very little when small amounts of strong acids or bases are added. Therefore, they may be used to prevent large changes in the pH of a formulation or solution.

As used herein, the term "fluorine-containing components" will be understood to mean soluble compounds that include a fluoride anion.

Those skilled in the art will appreciate that each of the layers discussed herein and used in the TFT may be formed using any common formation technique such as physical vapor deposition (PVD), atomic layer deposition (ALD), plasma enhanced atomic layer deposition (PE-ALD), atomic vapor deposition (AVD), ultraviolet assisted atomic layer deposition (UV-ALD), chemical vapor deposition (CVD), plasma enhanced chemical vapor deposition (PECVD), pulsed laser deposition (PLD), or evaporation. Generally, because of the structure and size of the display devices, PVD or PECVD are preferred methods of formation. However, any of these techniques are suitable for forming each of the various layers discussed herein. Those skilled in the art will appreciate that the teachings described herein are not limited by the technology used for the deposition process.

Figure 3:
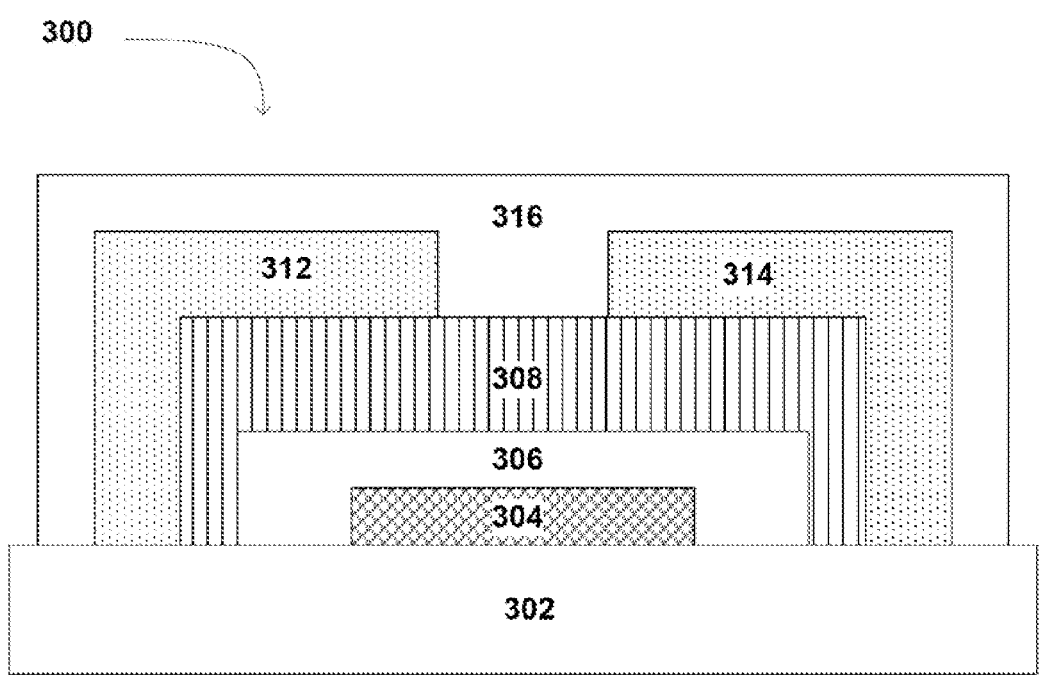
FIG. 3 is a simplified cross-sectional view of a TFT according to some embodiments.

In FIGS. 1, and 3, a TFT stack is illustrated using a simple inverted-staggered, bottom-gate, with etch-stopper island, device structure. Those skilled in the art will appreciate that the description and teachings herein can be readily applied to any simple or complex TFT structure, including inverted-staggered, bottom-gate, back-channel-etch device structures, co-planar device structures, inverted-staggered, bottom-gate, etch-stopper contact (via) hole device structures, self-aligned, inverted-staggered, bottom-gate, etch-stopper island device structures, and various device structures based on top-gate, bottom-gate, staggered, inverted-staggered, co-planar, back-channel-etch, single-gate, or double-gate features. The drawings are for illustrative purposes only and do not limit the application of the present disclosure.

As used herein, the phrase "site-isolated region" (SIR) will be understood to refer to one or more regions on a substrate that are separated and used for the evaluation of different materials, interface, device, or process parameters. The SIRs can be formed using many different methods such as scribing, deposition through a shadow mask, deposition using isolated deposition heads, lithography, and the like. Additionally, the SIRs may be defined as a result of the patterning of a top layer (e.g. a top electrode in a simple two terminal device), without the physical definition of underlying layers. The present disclosure is not limited by the method used to form the SIRs.

As used herein, the notation "(IIIA)" will be understood to represent the sum of the concentrations of all Group-IIIA elements. This notation will be used herein in calculations of the composition ratios of various elements. This notation will be understood to extend to each of the other Groups of the periodic table respectively (e.g. "(IA)", "(IIA)", "(IVA)", "(VIA)", "(IB)", "(IIB)", etc.).

As used herein, the notation "In—Ga—Zn—O" will be understood to include a material containing these elements in any ratio. This notation will be shortened to "IGZO" for brevity. Where a specific composition is discussed, the atomic concentrations (or ranges) will be provided. The notation is extendable to other materials and other elemental combinations.

As used herein, the notation "$In_xGa_yZn_zO_w$" will be understood to include a material containing these elements in a specific ratio given by x, y, z, and w (e.g. $In_{33}Ga_{33}Zn_{33}$ contains 33 atomic % In, 33 atomic % Ga, and 33 atomic % Zn). The notation is extendable to other materials and other elemental combinations.

As used herein, the notation "$(In,Ga)_x(Zn,Cd)_y(O,Se,S,Te)_z$" will be understood to include a material containing a total amount of Group-IIIA elements (i.e. In plus Ga, etc.) in a ratio given by "x", a total amount of Group-IIB elements (i.e. Zn plus Cd, etc.), etc. in a ratio given by "y", and a total amount of Group-VIA elements (i.e. O plus Se plus S plus Te, etc.) in a ratio given by "z". The notation is extendable to other materials and other elemental combinations.

As used herein, the terms "film" and "layer" will be understood to represent a portion of a stack. They will be understood to cover both a single layer as well as a multilayered structure (i.e. a nanolaminate). As used herein, these terms will be used synonymously and will be considered equivalent.

As used herein, "substrate" will be understood to generally be one of float glass, low-iron glass, borosilicate glass, display glass, alkaline earth boro-aluminosilicate glass, fusion drawn glass, flexible glass, specialty glass for high temperature processing, polyimide, plastics, polyethylene terephthalate (PET), etc. for either applications requiring optically transparent or non-transparent substrate functionality. For substrates with no need for transparency, substrates like aluminum foil, stainless steel, carbon steel, paper, cladded foils, etc. can be utilized.

The typical materials in a TFT stack consist of a substrate, a diffusion barrier layer, a gate electrode, source electrode, drain electrode, gate insulator, and a semiconducting channel layer, in addition to an optional etch stopper and/or passivation layer. As used herein, "metal-based semiconductor layer", and "metal-based semiconductor material", etc. will be understood to be equivalent and be understood to refer to a layer and/or material related to the channel layer. This disclosure will describe methods and apparatus for forming and evaluating at least portions of TFT devices based on metal-based semiconductor materials. The metal-based semiconductor materials may include at least one of metal oxides, metal oxy-nitrides, metal oxy-chalcogenides, or metal chalcogenides. In—Ga—Zn—O (IGZO), will be used as an example of a metal-based semiconductor material for purposes of illustration, but this is not intended to be limiting. Those skilled in the art will understand that the present disclosure can be applied to any suitable metal-based semiconductor material applicable to TFT devices.

FIG. 1 is a simplified cross-sectional view of a TFT according to some embodiments. Bottom gate electrode, 104, is formed above substrate, 102. As discussed previously, the substrate may be any commonly used substrate for display devices such as one of float glass, low-iron glass, borosilicate glass, display glass, alkaline earth boro-aluminosilicate glass, fusion drawn glass, flexible glass, specialty glass for high temperature processing, polyimide, plastics, PET, etc. for either applications requiring optically transparent or non-transparent substrate functionality. For substrates with no need for transparency, substrates like aluminum foil, stainless steel, carbon steel, paper, cladded foils, etc. can be utilized. The substrate optionally is covered by a diffusion barrier, (e.g. silicon oxide, silicon nitride, or silicon oxy-nitride). The bottom gate electrode, 104, is typically formed by a deposition process followed by a patterning process. Optionally, an anneal step is implemented prior to patterning, post patterning, or both. A typical deposition method involves sputter deposition. Patterning is typically performed by photolithography. The photolithography most commonly relies on wet etching, yet dry etching (e.g. reactive ion etching) can be used as well. Wet etch chemistries are most commonly aqueous, and for acidic wet etch formulations include a mixture of inorganic acids, optionally organic acids, and optionally an oxidizer like hydrogen peroxide, or nitric acid, and optionally other chemicals, either as stabilizers, to control critical dimension loss, taper angle, or etch selectivity. The gate electrode is most commonly a stack of two or more layers. Examples of suitable materials for the bottom gate electrode include a stack of Cu and a Cu-alloy, a stack of Cu and Mo, a stack of Cu and Ti, a stack of Cu and Mo—Ti alloy, a stack of Cu and Mo—Ta alloy, Cu, Mo, Al, a stack of Al and Mo, a stack of Al and Ti, or a stack of Al and Mo—Ti alloy. It should be noted that Al can contain a small concentration of Neodymium (Nd). It should be understood that the Cu in the Cu stacks, and Al in the Al stacks are thicker than the adjacent layers (e.g. Cu-alloy, or Mo—Ti alloy). Furthermore, the stacks can be a bi-layer of Cu and Cu-alloy, or a tri-layer of Cu-alloy/Cu/Cu-alloy, or Mo/Al/Mo. Typical Cu-alloys include Cu—Mg—Al, and Cu—Mn, wherein the Cu-alloys can also contain small concentrations of phosphides, Mg, or Ca. For some transparent TFTs, the gate electrode consists of a transparent conductive oxide, (e.g. In—Sn—O (ITO), In—Zn—O (IZO)), and related materials. The performance of the gate electrode can be sensitive to composition and process parameters. The same holds for the diffusion barrier layer underneath the gate electrode.

Gate dielectric, 106, is formed above bottom gate electrode, 104. Examples of suitable materials for the gate dielectric include silicon oxide and silicon nitride, a stack of silicon nitride and silicon oxide, a mixture, multi-layer, or combination thereof of a high bandgap (e.g. silicon oxide, or aluminum oxide) and high-k dielectric material (e.g. hafnium oxide, zirconium oxide, titanium oxide), a high bandgap material (e.g. silicon oxide, or aluminum oxide) or high-k dielectric material (e.g. hafnium oxide, zirconium oxide, titanium oxide). The gate dielectric, 106, is typically formed by a deposition process followed by a patterning process, although, the patterning process is often delayed until several other deposition and patterning steps have been performed. Optionally, an anneal step is implemented prior to patterning, post patterning, or both. The gate dielectric, 106, may be formed using deposition techniques such as PVD, ALD, or PECVD, or a combination thereof. The performance of the gate dielectric can be sensitive to composition and process parameters. The gate dielectric, 106, may be patterned using either wet techniques such as chemical etching, or dry techniques such as reactive ion etching (RIE). In both of these techniques, parameters such as the uniformity, etch rate, selectivity, critical dimension loss, taper angle, cost, throughput, etc. are sensitive to the process parameters of the etch process.

Metal-based semiconductor layer, 108, is formed above gate dielectric, 106. The metal-based semiconductor layer, 108, is typically formed by a deposition process followed by a patterning process. Optionally, an anneal step is implemented prior to patterning, post patterning, or both. The anneal step may occur just below atmospheric pressure, at atmospheric pressure, or slightly above atmospheric pressure. Typical anneal ambient atmospheres contain at least one of oxygen, ozone, water, hydrogen, nitrogen, argon, or a combination thereof. In addition, the metal-based semiconductor layer may be treated prior to etch stopper or source/drain deposition with a plasma containing $O_2$, or $N_2O$, or $H_2$. The metal-based semiconductor layer, 108, may be formed using deposition techniques such as PVD, MOCVD, or wet depositions, (e.g. based on sol-gels). The performance of the metal-based semiconductor layer can be sensitive to composition and process parameters. Examples of suitable materials for the metal-based semiconductor layer include indium gallium zinc oxide (In—Ga—Zn—O or IGZO), In—Zn—O (IZO), Zn—Sn—O (ZTO), Hf—In—Zn—O (HIZO), and Al—Zn—Sn—O (AZTO), oxy-nitrides such as Zn—O—N (ZnON), In—O—N (InON), Sn—O—N (SnON), c-axis aligned crystalline (CAAC) materials such as CAAC-IGZO, or polycrystalline materials such as ZnO or In—Ga—O (IGO). Indium in these materials might be partially or completely replaced by Sn, or Sb. Gallium in these materials might be partially or completely replaced by one or more of Al, Hf, In, Nb, Si, Sn, Ta, Ti, Zn, or Zr. Oxygen in these materials might be partially or completely replaced by one or more of C, N, P, S, Se, Si, or Te. Other potential candidates as active channel (semiconductor) materials are refractory metal chalcogenides, (e.g. molybdenum sulfides). It should be noted that it is possible to deposit a bi-, or tri-layer, where each layer has a composition optimized for its functionality, the latter being contact layer with the gate insulator, bulk active channel layer, and contact layer with the source and drain electrodes and etch stopper or passivation layers. Furthermore, the active (semiconducting) channel layer might have a continuous change in composition (e.g. a gradient) through the thickness of the film. Common extrinsic (n-type) dopants for ZnO-based semiconductors are Al, B, Cr, Ga, H, In and Li. Furthermore, the metal cations in the metal-based semiconductor material (e.g. IGZO) may be partially or completely replaced by Ag, As, Au, Bi, Cd, Cu, Zn, Ga, Ge, Hg, In, Pb, Sb, Sn, and Tl. Other dopants of interest include halogens like Cl and F. The metal-based semiconductor layer, 108, may be patterned using either wet techniques such as chemical etching, or dry techniques such as RIE. In both of these techniques, parameters such as the uniformity, etch rate, selectivity, critical dimension loss, taper angle, cost, throughput, etc. are sensitive to the process parameters of the etch process. This disclosure will use IGZO as an example, but this is not meant to be limiting. The techniques described herein can be applied to any material suitable for display applications.

Etch stopper, 110, is formed above metal-based semiconductor layer, 108. The etch stopper, 110, is typically formed by a deposition process followed by a patterning process. Optionally, an anneal step is implemented prior to patterning, post patterning, or both. The etch stopper, 110, may be formed using deposition techniques such as PVD, ALD, PECVD, or by wet coating techniques. The performance of the etch stopper can be sensitive to composition and process parameters. Examples of suitable materials for the etch stopper include silicon oxide, silicon nitride, silicon oxy-nitride, a stack of silicon nitride and silicon oxide, a mixture, multi-layer, or combination thereof of a high bandgap material (e.g. silicon oxide, or aluminum oxide) and high-k dielectric material (e.g. hafnium oxide, zirconium oxide, titanium oxide), a high bandgap (e.g. silicon oxide, or aluminum oxide) or high-k dielectric material (e.g. hafnium oxide, zirconium oxide, titanium oxide). In addition to these inorganic materials, various organic materials may be used as etch stopper materials as well. Examples of organic etch stopper materials include photoresist, organic polymers, UV-curable polymers, and heat-curable polymers. The etch stopper, 110, may be patterned using either wet techniques such as chemical etching, or dry techniques such as RIE. In both of these techniques, parameters such as the uniformity, etch rate, selectivity, critical dimension loss, taper angle, cost, throughput, etc. are sensitive to the process parameters of the etch process.

Source and drain electrodes, 112 and 114, are formed above etch stopper, 110 and exposed regions of the metal-based semiconductor layer, 108. The source and drain electrodes, 112 and 114, are typically formed by a deposition process followed by a patterning process. Optionally, an anneal step is implemented prior to patterning, post patterning, or both. The source and drain electrodes, 112 and 114, may be formed using deposition techniques such as PVD, wet deposition (e.g. plating), or MOCVD (for TCOs). Typically, the deposition steps involve sputter deposition. Patterning is commonly performed by photolithography. The photolithography most commonly relies on wet etching, yet dry etching (e.g. reactive ion etching) can be used as well. Wet etch chemistries are most commonly aqueous, and for acidic wet etch formulations include a mixture of inorganic acids, optionally organic acids, and optionally an oxidizer like hydrogen peroxide, or nitric acid, and optionally other chemicals, either as stabilizers, to control critical dimension loss, taper angle, or etch selectivity. The performance of the source and drain electrodes can be sensitive to composition and process parameters. The source/drain electrode is most commonly a stack of two or more layers. Examples of suitable materials for the source/drain electrode include a stack of Cu and a Cu-alloy, a stack of Cu and Mo, a stack of Cu and Ti, a stack of Cu and Mo-Ti alloy, a stack of Cu and Mo—Ta alloy, Cu, Mo, Al, a stack of Al and Mo, a stack of Al and Ti, or a stack of Al and Mo—Ti alloy. It should be noted that Al can contain a small concentration of Neodymium (Nd). It should be understood that the Cu in the Cu stacks, and Al in the Al stacks are thicker than the adjacent layers (e.g. Cu-alloy, or Mo—Ti alloy). Furthermore, the stacks can be a bi-layer of Cu and Cu-alloy, or a tri-layer of Cu-alloy/Cu/Cu-alloy, or Mo/Al/Mo. Typical Cu-alloys include Cu—Mg—Al, and Cu-Mn, wherein the Cu-alloys can also contain small concentrations of phosphides, Mg, or Ca. For some transparent TFTs, the source and drain electrodes consist of a transparent conductive oxide, (e.g. In—Sn—O (ITO), In—Zn—O (IZO)), and related materials. The source and drain electrodes, 112 and 114, may be patterned using either wet techniques such as chemical etching, or dry techniques such as RIE. In both of these techniques, parameters such as the uniformity, etch rate, selectivity, critical dimension loss, taper angle, cost, throughput, etc. are sensitive to the process parameters of the etch process.

Passivation layer, 116, is formed above source and drain electrodes, 112 and 114. The passivation layer, 116, is typically formed by a deposition process followed by a patterning process. Optionally, an anneal step is implemented prior to patterning, post patterning, or both. The passivation layer, 116, may be formed using deposition techniques such as PVD, ALD, or PECVD, or by wet coating techniques. The performance of the passivation layer can be sensitive to composition and process parameters. Examples of suitable materials for the passivation layer include silicon oxide, silicon nitride, silicon oxy-nitride, a stack of silicon nitride and silicon oxide, a mixture, multi-layer, or combination thereof of a high bandgap (e.g. silicon oxide, or aluminum oxide) and high-k dielectric material (e.g. hafnium oxide, zirconium oxide, titanium oxide), a high bandgap material (e.g. silicon oxide, or aluminum oxide) or high-k dielectric material (e.g. hafnium oxide, zirconium oxide, titanium oxide). The passivation layer, 116, may be patterned using either wet techniques such as chemical etching, or dry techniques such as RIE. In both of these techniques, parameters such as the uniformity, etch rate, selectivity, critical dimension loss, taper angle, cost, throughput, etc. are sensitive to the process parameters of the etch process.

In some embodiments, between one or more of the deposition and patterning steps discussed previously (e.g. the formation of the gate electrode layer, the gate dielectric layer, the metal-based semiconductor layer, the etch stopper layer, the source/drain electrode layers, or the passivation layer), the surface of the deposited film may be subjected to a treatment process before or after the patterning step. Examples of treatment processes include degas steps to remove adsorbed moisture due to exposure to ambient, anneal treatments, surface cleaning treatments (either wet or dry), and plasma treatments (e.g. exposure to plasma generated species of Ar, $H_2$, $N_2$, $N_2O$, $O_2$, $O_3$, etc.).

Figure 2:
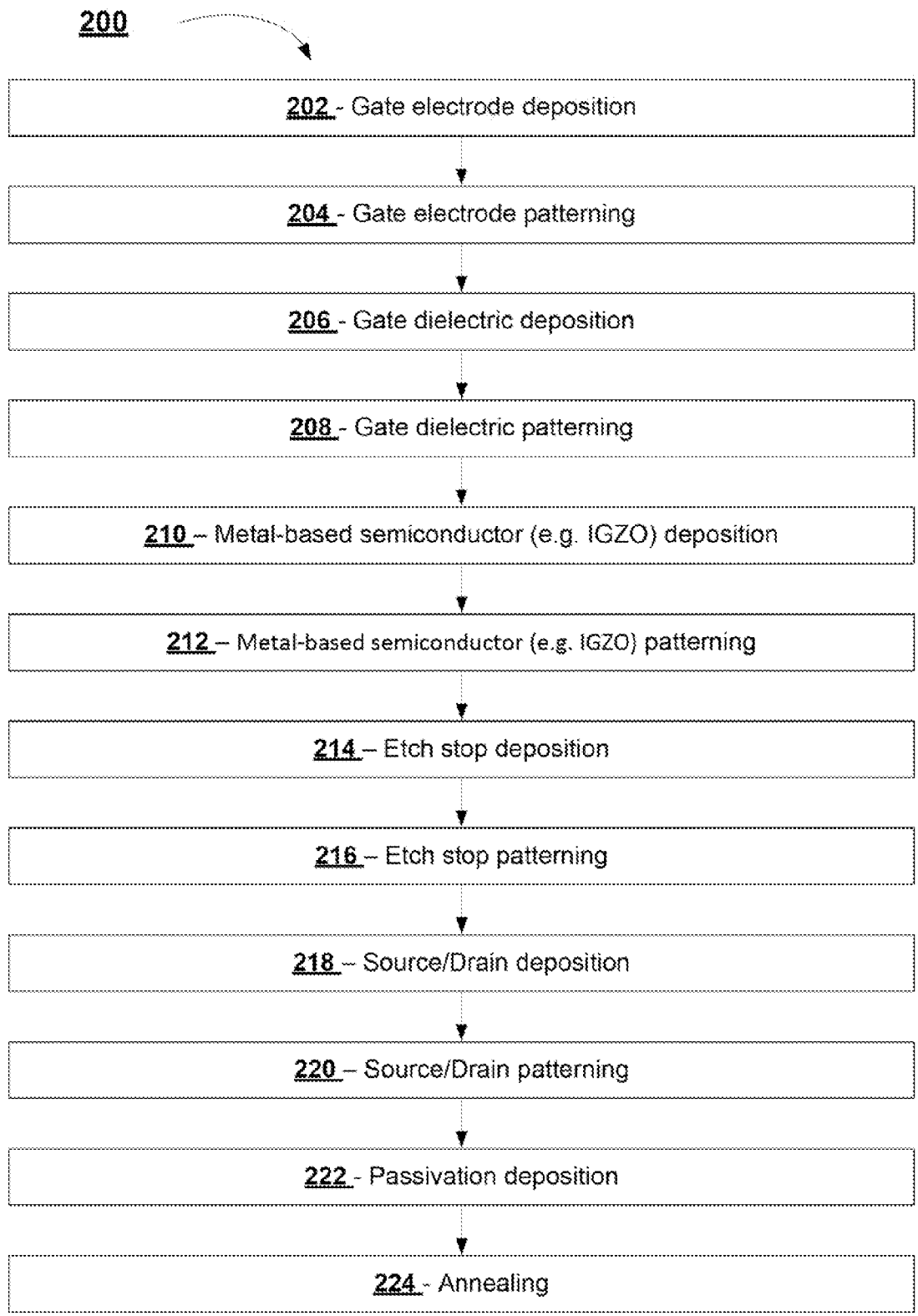
FIG. 2 is a flow chart illustrating the steps of a method according to some embodiments.
Figure 4:
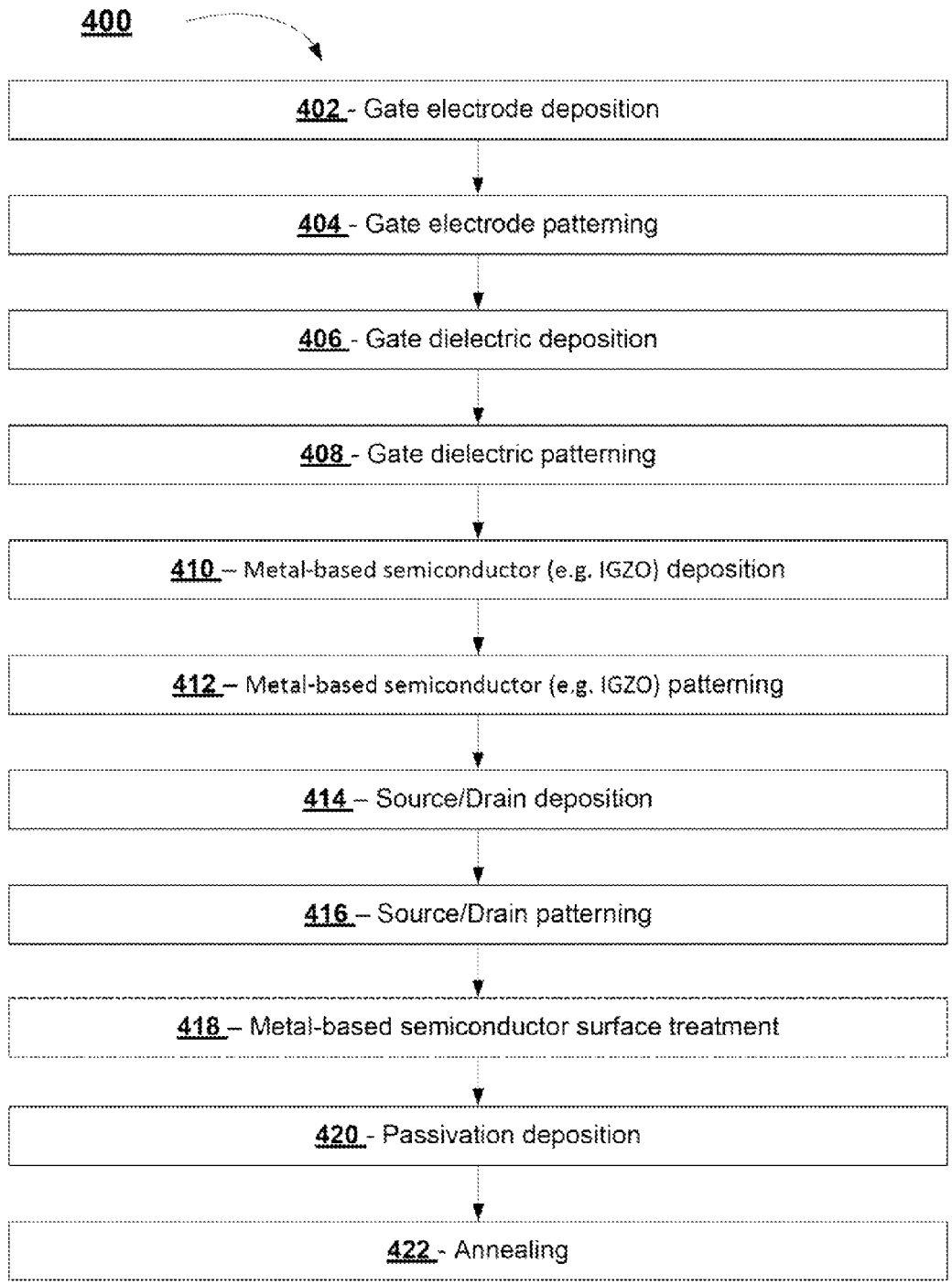
FIG. 4 is a flow chart illustrating the steps of a method according to some embodiments.

FIG. 2 is a flow chart illustrating the steps of a method according to some embodiments. Those skilled in the art will understand that the sequence of steps listed in FIG. 4 is just an example and that other sequences that include other steps or exclude some of these steps are also within the scope of the present disclosure. In step 202, a gate electrode layer is deposited above the substrate. Typically, the gate electrode is a material with high conductivity such as a metal, metal alloy, or conductive compound (e.g. titanium nitride, tantalum nitride, and the like). Examples of suitable materials for the gate electrode include a stack of Cu and a Cu-alloy, a stack of Cu and Mo, a stack of Cu and Ti, a stack of Cu and Mo—Ti alloy, a stack of Cu and Mo-Ta alloy, Cu, Mo, Al, a stack of Al and Mo, a stack of Al and Ti, or a stack of Al and Mo—Ti alloy. It should be noted that Al can contain a small concentration of Neodymium (Nd). It should be understood that the Cu in the Cu stacks, and Al in the Al stacks are thicker than the adjacent layers (e.g. Cu-alloy, or Mo—Ti alloy). Furthermore, the stacks can be a bi-layer of Cu and Cu-alloy, or a tri-layer of Cu-alloy/Cu/Cu-alloy, or Mo/Al/Mo. Typical Cu-alloys include Cu—Mg—Al, and Cu—Mn, wherein the Cu-alloys can also contain small concentrations of phosphides, Mg, or Ca. For some transparent TFTs, the gate electrode consists of a transparent conductive oxide, (e.g. In—Sn—O (ITO), In—Zn—O (IZO)), and related materials. The performance of the gate electrode can be sensitive to composition and process parameters. The same holds for the diffusion barrier layer underneath the gate electrode. The gate electrode layer can be deposited using well known deposition techniques such as PVD, CVD, PECVD, PLD, evaporation, etc.

In step 204, the gate electrode layer is patterned. The gate electrode layer is patterned using known photolithography techniques followed by etching the gate electrode layer using wet and/or dry etching processes. In some embodiments, the gate electrode layer is etched using a combination of wet and dry etching processes. Examples of wet etching processes include the application of acidic, basic, or organic-solvent based solutions (depending on the material to be etched) to the gate electrode layer. Examples of dry etching processes include reactive ion etching (RIE), plasma etching, ion milling, and the like.

In step 206, a gate dielectric layer is deposited above the gate electrode layer. Typically, the gate dielectric is an insulating material such as a silicon oxide, silicon nitride, or a metal oxide such as aluminum oxide, and the like. Examples of suitable materials for the gate dielectric include silicon oxide and silicon nitride, a stack of silicon nitride and silicon oxide, a mixture, multi-layer, or combination thereof of a high bandgap (e.g. silicon oxide, or aluminum oxide) and high-k dielectric material (e.g. hafnium oxide, zirconium oxide, titanium oxide), a high bandgap material (e.g. silicon oxide, or aluminum oxide) or high-k dielectric material (e.g. hafnium oxide, zirconium oxide, titanium oxide). In some embodiments, the deposition process is a vacuum-based process such as PVD, ALD, PE-ALD, AVD, UV-ALD, CVD, PECVD, PLD, or evaporation. In some embodiments, the deposition process is a solution-based process such as printing or spraying of inks, screen printing, inkjet printing, slot die coating, gravure printing, wet chemical depositions, or from sol-gel methods, such as the coating, drying, and firing of polysilazanes. Furthermore, the substrates may be processed in many configurations such as single substrate processing, multiple substrate batch processing, in-line continuous processing, in-line "stop and soak" processing, or roll-to-roll processing.

In step 208, the gate dielectric layer is patterned. Optionally, an anneal step is implemented prior to patterning, post patterning, or both. The gate dielectric layer is patterned using known photolithography techniques followed by etching the gate dielectric layer using wet and/or dry etching processes. In some embodiments, the gate dielectric layer is etched using a combination of wet and dry etching processes. Examples of wet etching processes include the application of acidic, basic, or organic-solvent based solutions (depending on the material to be etched) to the gate dielectric layer. Examples of dry etching processes include reactive ion etching (RIE), plasma etching, ion milling, and the like.

In step 210, a metal-based semiconductor layer is deposited above the gate dielectric layer. Examples of suitable materials for the semiconductor layer include indium gallium zinc oxide (In—Ga—Zn—O or IGZO), amorphous silicon, low-temperature polysilicon, In—Zn—O (IZO), Zn—Sn—O (ZTO), Hf—In—Zn—O (HIZO), and Al—Zn—Sn—O (AZTO), oxy-nitrides such as Zn—O—N (ZnON), In—O—N (InON), Sn—O—N (SnON), c-axis aligned crystalline (CAAC) materials such as CAAC-IGZO, or polycrystalline materials such as ZnO or In—Ga—O (IGO). Indium in these materials might be partially or completely replaced by Sn, or Sb. Gallium in these materials might be partially or completely replaced by one or more of Al, Hf, In, Nb, Si, Sn, Ta, Ti, Zn, or Zr. Oxygen in these materials might be partially or completely replaced by one or more of C, N, P, S, Se, Si, or Te. Other potential candidates as active channel (semiconductor) materials are refractory metal chalcogenides, (e.g. molybdenum sulfides). It should be noted that it is possible to deposit a bi-, or tri-layer, where each layer has a composition optimized for its functionality, the latter being contact layer with the gate insulator, bulk active channel layer, and contact layer with the source and drain electrodes and etch stopper or passivation layers. Furthermore, the active (semiconducting) channel layer might have a continuous change in composition (e.g. a gradient) through the thickness of the film. Common extrinsic (n-type) dopants for ZnO-based semiconductors are Al, B, Cr, Ga, H, In and Li. Furthermore, the metal cations in IGZO may be partially or completely replaced by Ag, As, Au, Bi, Cd, Cu, Zn, Ga, Ge, Hg, In, Pb, Sb, Sn, and TI. Other dopants of interest include halogens like CI and F. In some embodiments, the deposition process is a vacuum-based process such as PVD, ALD, PE-ALD, AVD, UV-ALD, CVD, PECVD, or evaporation. In some embodiments, the deposition process is a solution-based process such as printing or spraying of inks, screen printing, inkjet printing, slot die coating, gravure printing, wet chemical depositions, or from sol-gel methods. Furthermore, the substrates may be processed in many configurations such as single substrate processing, multiple substrate batch processing, in-line continuous processing, in-line "stop and soak" processing, or roll-to-roll processing.

In step 212, the metal-based semiconductor layer is patterned. Optionally, an anneal step is implemented prior to patterning, post patterning, or both. The anneal step may occur just below atmospheric pressure, at atmospheric pressure, or slightly above atmospheric pressure. Typical anneal ambient atmospheres contain at least one of oxygen, ozone, water, hydrogen, nitrogen, argon, or a combination thereof. In addition, the semiconductor layer may be treated prior to etch stopper or source/drain deposition with a plasma containing $O_2$ or $N_2O$. The metal-based semiconductor layer is patterned using known photolithography techniques followed by etching the metal-based semiconductor layer using wet and/or dry etching processes. In some embodiments, the metal-based semiconductor layer is etched using a combination of wet and dry etching processes. Examples of wet etching processes include the application of acidic, basic, or organic-solvent based solutions (depending on the material to be etched) to the metal-based semiconductor layer. Examples of dry etching processes include reactive ion etching (RIE), plasma etching, ion milling, and the like.

In some embodiments the metal-based semiconductor is optionally annealed either after deposition or after patterning (not shown). The annealing serves to control doping in the metal-based semiconductor, or passivate defects in or near the metal-based semiconductor that may have been formed during any of the deposition and/or patterning/etching steps. The anneal step may occur just below atmospheric pressure, at atmospheric pressure, or slightly above atmospheric pressure. Typical anneal ambient atmospheres contain at least one of oxygen, ozone, water, hydrogen, nitrogen, argon, or a combination thereof. The annealing is typically performed in a temperature range between 200 C and 400 C for times between 15 minutes and 90 minutes.

In step 214, an etch stop layer is deposited above the metal-based semiconductor layer. Examples of suitable materials for the etch stopper include silicon oxide, silicon nitride, a stack of silicon nitride and silicon oxide, a mixture, multi-layer, or combination thereof of a high bandgap material (e.g. silicon oxide, or aluminum oxide) and high-k dielectric material (e.g. hafnium oxide, zirconium oxide, titanium oxide), a high bandgap (e.g. silicon oxide, or aluminum oxide) or high-k dielectric material (e.g. hafnium oxide, zirconium oxide, titanium oxide). In addition to these inorganic materials, various organic materials may be used as etch stopper materials as well. Examples of organic etch stopper materials include photoresist, organic polymers, UV-curable polymers, and heat-curable polymers. In some embodiments, the deposition process is a vacuum-based process such as PVD, ALD, PE-ALD, AVD, UV-ALD, CVD, PECVD, PLD, or evaporation. In some embodiments, the deposition process is a solution-based process such as printing or spraying of inks, screen printing, inkjet printing, slot die coating, gravure printing, wet chemical depositions, or from sol-gel methods, such as the coating, drying, and firing of polysilazanes. Furthermore, the substrates may be processed in many configurations such as single substrate processing, multiple substrate batch processing, in-line continuous processing, in-line "stop and soak" processing, or roll-to-roll processing.

In step 216, the etch stop layer is patterned. Optionally, an anneal step is implemented prior to patterning, post patterning, or both. The etch stop layer is patterned using known photolithography techniques followed by etching the etch stop layer using wet and/or dry etching processes. In some embodiments, the etch stop layer is etched using a combination of wet and dry etching processes. Examples of wet etching processes include the application of acidic, basic, or organic-solvent based solutions (depending on the material to be etched) to the etch stop layer. Examples of dry etching processes include reactive ion etching (RIE), plasma etching, ion milling, and the like. Upon wet or dry etching, the upper surface of the underlying metal-based semiconductor layer may become damaged, negatively affecting the transistor properties. This may require an additional step to remove or convert a portion of the upper surface of the underlying metal-based semiconductor layer to recover the required transistor properties.

In step 218, a source/drain electrode layer is deposited above the etch stop layer. The source and drain electrodes are typically deposited as a single layer or stack of two to three layers, and then defined during the patterning step. Typically, the source/drain electrode is a material with high conductivity such as a metal, metal alloy, or conductive compound (e.g. titanium nitride, tantalum nitride, and the like). Examples of suitable materials for the source and drain electrode include a stack of Cu and a Cu-alloy, a stack of Cu and Mo, a stack of Cu and Ti, a stack of Cu and Mo—Ti alloy, a stack of Cu and Mo—Ta alloy, Cu, Mo, Al, a stack of Al and Mo, a stack of Al and Ti, or a stack of Al and Mo—Ti alloy. It should be noted that Al can contain a small concentration of Neodymium (Nd). It should be understood that the Cu in the Cu stacks, and Al in the Al stacks are thicker than the adjacent layers (e.g. Cu-alloy, or Mo—Ti alloy). Furthermore, the stacks can be a bi-layer of Cu and Cu-alloy, or a tri-layer of Cu-alloy/Cu/Cu-alloy, or Mo/Al/Mo. Typical Cu-alloys include Cu—Mg—Al, and Cu—Mn, wherein the Cu-alloys can also contain small concentrations of phosphides, Mg, or Ca. For some transparent TFTs, the source and drain electrodes consist of a transparent conductive oxide, (e.g. In—Sn—O (ITO), In—Zn—O (IZO)), and related materials. The source/drain electrode layer can be deposited using well known deposition techniques such as PVD, CVD, PECVD, PLD, evaporation, etc.

In step 220, the source/drain electrode layer is patterned into individual source and drain electrodes. Optionally, an anneal step is implemented prior to patterning, post patterning, or both. The source/drain electrode layer is patterned using known photolithography techniques followed by etching the source/drain electrode layer using wet and/or dry etching processes. In some embodiments, the source/drain electrode layer is etched using a combination of wet and dry etching processes. Examples of wet etching processes include the application of acidic, basic, or organic-solvent based solutions (depending on the material to be etched) to the source/drain electrode layer. Wet etch chemistries are most commonly aqueous, and pending the source and drain electrodes to be selectively etched over the semiconductor with/without etch stop layer, either acidic or alkaline, and include for acidic etch formulations one or more acids, either inorganic or organic, and optionally an oxidizer like hydrogen peroxide, or nitric acid, and optionally other chemicals, either as stabilizers, to control critical dimension loss, taper angle, or etch selectivity. Examples of dry etching processes include reactive ion etching (RIE), plasma etching, ion milling, and the like. The performance of the source and drain electrodes can be sensitive to composition and process parameters.

In step 222, a passivation layer is deposited above the source/drain layer to form a TFT stack. Typically, the passivation layer is an insulating material such as a silicon oxide, silicon nitride, or a metal oxide such as aluminum oxide, and the like. Examples of suitable materials for the passivation layer include silicon oxide and silicon nitride, a stack of silicon nitride and silicon oxide, a mixture, multi-layer, or combination thereof of a high bandgap (e.g. silicon oxide, or aluminum oxide) and high-k dielectric material (e.g. hafnium oxide, zirconium oxide, titanium oxide), a high bandgap material (e.g. silicon oxide, or aluminum oxide) or high-k dielectric material (e.g. hafnium oxide, zirconium oxide, titanium oxide). The passivation layer can be deposited using well known deposition techniques such as PVD, CVD, PECVD, PLD, evaporation, etc. Typically, the passivation layer is patterned (not shown).

In step 224, the TFT stack is annealed. The annealing serves to reduce (contact) resistance, control doping in the semiconductor, or passivate defects in or near the semiconductor that may have been formed during any of the deposition and/or patterning/etching steps. The anneal step may occur just below atmospheric pressure, at atmospheric pressure, or slightly above atmospheric pressure. Typical anneal ambient atmospheres contain at least one of oxygen, ozone, water, hydrogen, nitrogen, argon, or a combination thereof. The annealing is typically performed in a temperature range between 200 C and 400 C for times between 15 minutes and 90 minutes.

In some embodiments, between one or more of the deposition and patterning steps discussed previously (e.g. the formation of the gate electrode layer, the gate dielectric layer, the metal-based semiconductor layer, the etch stopper layer, the source/drain electrode layers, or the passivation layer), the surface of the deposited film may be subjected to a treatment process before or after the patterning step. Examples of treatment processes include degas steps to remove adsorbed moisture due to exposure to ambient, anneal treatments, surface cleaning treatments (either wet or dry), and plasma treatments (e.g. exposure to plasma generated species of Ar, $H_2$, $N_2$, $N_2O$, $O_2$, $O_3$, etc.).

The performance of the metal-based semiconductor layer will be sensitive to parameters such as composition (majority elements, and minority impurities), crystal structure, oxygen vacancies, hydrogen concentration, surface defects, interface state density, and the like. Many of these parameters will be influenced by the processing of the material and the process conditions to which the material is exposed. As an example, in the method as outlined in FIG. 2, the metal-based semiconductor material is exposed to air (after deposition), photoresist and photoresist developer (during patterning), etch chemistries (either wet, dry, or both), processing conditions related to the deposition of the etch stop layer (e.g. elevated temperatures, plasma bombardment, etc.), processing conditions related to the patterning of the etch stop layer (either wet, dry, or both), and processing conditions related to the deposition of the source/drain layer (e.g. elevated temperatures, plasma bombardment, etc.). Those skilled in the art will understand that the active channel of the metal-based semiconductor layer is protected by the etch stop layer in case of a TFT device structure with an etch stop layer, but that regions of the metal-based semiconductor layer outside the active channel will be exposed to the processing conditions related to the deposition of the source/drain layer.

FIG. 3 is a simplified cross-sectional view of a TFT according to some embodiments. Gate electrode, 304, is formed above substrate, 302. As discussed previously, the substrate may be any commonly used substrate for display devices such as one of float glass, low-iron glass, borosilicate glass, display glass, alkaline earth boro-aluminosilicate glass, fusion drawn glass, flexible glass, specialty glass for high temperature processing, polyimide, plastics, PET, etc. for either applications requiring transparent or non-transparent substrate functionality. For substrates with no need for transparency, substrates like aluminum foil, stainless steel, carbon steel, paper, cladded foils, etc. can be utilized. The substrate optionally is covered by a diffusion barrier, (e.g. silicon oxide, silicon nitride, or silicon oxy-nitride). The bottom gate electrode, 304, is typically formed by a deposition process followed by a patterning process. Optionally, an anneal step is implemented prior to patterning, post patterning, or both. A typical deposition method involves sputter deposition. Patterning is typically performed by photolithography. The photolithography most commonly relies on wet etching, yet dry etching (e.g. reactive ion etching) can be used as well. Wet etch chemistries are most commonly aqueous, and for acidic wet etch formulations include a mixture of inorganic acids, optionally organic acids, and optionally an oxidizer like hydrogen peroxide, or nitric acid, and optionally other chemicals, either as stabilizers, to control critical dimension loss, taper angle, or etch selectivity. The gate electrode is most commonly a stack of two or more layers. Examples of suitable materials for the bottom gate electrode include a stack of Cu and a Cu-alloy, a stack of Cu and Mo, a stack of Cu and Ti, a stack of Cu and Mo—Ti alloy, a stack of Cu and Mo—Ta alloy, Cu, Mo, Al, a stack of Al and Mo, a stack of Al and Ti, or a stack of Al and Mo—Ti alloy. It should be noted that Al can contain a small concentration of Neodymium (Nd). It should be understood that the Cu in the Cu stacks, and Al in the Al stacks are thicker than the adjacent layers (e.g. Cu-alloy, or Mo—Ti alloy). Furthermore, the stacks can be a bi-layer of Cu and Cu-alloy, or a tri-layer of Cu-alloy/Cu/Cu-alloy, or Mo/Al/Mo. Typical Cu-alloys include Cu—Mg—Al, and Cu—Mn, wherein the Cu-alloys can also contain small concentrations of phosphides, Mg, or Ca. For some transparent TFTs, the gate electrode consists of a transparent conductive oxide, (e.g. In—Sn—O (ITO), In—Zn—O (IZO)), and related materials. The performance of the gate electrode can be sensitive to composition and process parameters. The same holds for the diffusion barrier layer underneath the gate electrode.

Gate dielectric, 306, is formed above bottom gate electrode, 304. Examples of suitable materials for the gate dielectric include silicon oxide and silicon nitride, a stack of silicon nitride and silicon oxide, a mixture, multi-layer, or combination thereof of a high bandgap (e.g. silicon oxide, or aluminum oxide) and high-k dielectric material (e.g. hafnium oxide, zirconium oxide, titanium oxide), a high bandgap material (e.g. silicon oxide, or aluminum oxide) or high-k dielectric material (e.g. hafnium oxide, zirconium oxide, titanium oxide). The gate dielectric, 306, is typically formed by a deposition process followed by a patterning process. Optionally, an anneal step is implemented prior to patterning, post patterning, or both. The gate dielectric, 306, may be formed using deposition techniques such as PVD, ALD, or PECVD, or a combination thereof. The performance of the gate dielectric can be sensitive to composition and process parameters. The gate dielectric, 306, may be patterned using either wet techniques such as chemical etching, or dry techniques such as reactive ion etching (RIE). In both of these techniques, parameters such as the uniformity, etch rate, selectivity, critical dimension loss, taper angle, cost, throughput, etc. are sensitive to the process parameters of the etch process.

Metal-based semiconductor layer, 308, is formed above gate dielectric, 106. The metal-based semiconductor layer, 308, is typically formed by a deposition process followed by a patterning process. Optionally, an anneal step is implemented prior to patterning, post patterning, or both. The anneal step may occur just below atmospheric pressure, at atmospheric pressure, or slightly above atmospheric pressure. Typical anneal ambient atmospheres contain at least one of oxygen, ozone, water, hydrogen, nitrogen, argon, or a combination thereof. In addition, the metal-based semiconductor layer may be treated prior to etch stopper or source/drain deposition with a plasma containing $O_2$ or $N_2O$. The metal-based semiconductor layer, 308, may be formed using deposition techniques such as PVD, MOCVD, or wet depositions, (e.g. based on sol-gels). The performance of the metal-based semiconductor layer can be sensitive to composition and process parameters. Examples of suitable materials for the metal-based semiconductor layer include indium gallium zinc oxide (In—Ga—Zn—O or IGZO), amorphous silicon, low-temperature polysilicon, In—Zn—O (IZO), Zn—Sn—O (ZTO), Hf—In—Zn—O (HIZO), and Al—Zn—Sn—O (AZTO), oxy-nitrides such as Zn—O—N (ZnON), In—O—N (InON), Sn—O—N (SnON), c-axis aligned crystalline (CAAC) materials such as CAAC-IGZO, or polycrystalline materials such as ZnO or In—Ga—O (IGO). Indium in these materials might be partially or completely replaced by Sn, or Sb. Gallium in these materials might be partially or completely replaced by one or more of Al, Hf, In, Nb, Si, Sn, Ta, Ti, Zn, or Zr. Oxygen in these materials might be partially or completely replaced by one or more of C, N, P, S, Se, Si, or Te. Other potential candidates as active channel (semiconductor) materials are refractory metal chalcogenides, (e.g. molybdenum sulfides). It should be noted that it is possible to deposit a bi-, or tri-layer, where each layer has a composition optimized for its functionality, the latter being contact layer with the gate insulator, bulk active channel layer, and contact layer with the source and drain electrodes and etch stopper or passivation layers. Furthermore, the active (semiconducting) channel layer might have a continuous change in composition (e.g. a gradient) through the thickness of the film. Common extrinsic (n-type) dopants for ZnO-based semiconductors are Al, B, Cr, Ga, H, In and Li. Furthermore, the metal cations in the metal-based semiconductor material (e.g. IGZO) may be partially or completely replaced by Ag, As, Au, Bi, Cd, Cu, Zn, Ga, Ge, Hg, In, Pb, Sb, Sn, and Tl. Other dopants of interest include halogens like Cl and F. The metal-based semiconductor layer, 108, may be patterned using either wet techniques such as chemical etching, or dry techniques such as RIE. In both of these techniques, parameters such as the uniformity, etch rate, selectivity, critical dimension loss, taper angle, cost, throughput, etc. are sensitive to the process parameters of the etch process. This disclosure will use IGZO as an example, but this is not meant to be limiting. The techniques described herein can be applied to any material suitable for display applications.

Source and drain electrodes, 312 and 314, are formed above the metal-based semiconductor layer, 308. The source and drain electrodes, 312 and 314, are typically formed by a deposition process followed by a patterning process. Optionally, an anneal step is implemented prior to patterning, post patterning, or both. The source and drain electrodes, 312 and 314, may be formed using deposition techniques such as PVD, wet deposition (e.g. plating), or MOCVD (for TCOs). Typically, the deposition steps involve sputter deposition. Patterning is commonly performed by photolithography. The photolithography most commonly relies on wet etching, yet dry etching (e.g. reactive ion etching) can be used as well. Wet etch chemistries are most commonly aqueous, and for acidic wet etch formulations include a mixture of inorganic acids, optionally organic acids, and optionally an oxidizer like hydrogen peroxide, or nitric acid, and optionally other chemicals, either as stabilizers, to control critical dimension loss, taper angle, or etch selectivity. The performance of the source and drain electrodes can be sensitive to composition and process parameters. The source and drain electrodes are most commonly a stack of two or more layers. Examples of suitable materials for the source and drain electrodes include a stack of Cu and a Cu-alloy, a stack of Cu and Mo, a stack of Cu and Ti, a stack of Cu and Mo—Ti alloy, a stack of Cu and Mo—Ta alloy, Cu, Mo, Al, a stack of Al and Mo, a stack of Al and Ti, or a stack of Al and Mo—Ti alloy. It should be noted that Al can contain a small concentration of Neodymium (Nd). It should be understood that the Cu in the Cu stacks, and Al in the Al stacks are thicker than the adjacent layers (e.g. Cu-alloy, or Mo—Ti alloy). Furthermore, the stacks can be a bi-layer of Cu and Cu-alloy, or a tri-layer of Cu-alloy/Cu/Cu-alloy, or Mo/Al/Mo. Typical Cu-alloys include Cu—Mg—Al, and Cu—Mn, wherein the Cu-alloys can also contain small concentrations of phosphides, Mg, or Ca. For some transparent TFTs, the source and drain electrodes consist of a transparent conductive oxide, (e.g. In—Sn—O (ITO), In—Zn—O (IZO)), and related materials. The source and drain electrodes, 312 and 314, may be patterned using either wet techniques such as chemical etching, or dry techniques such as RIE. In both of these techniques, parameters such as the uniformity, etch rate, selectivity, critical dimension loss, taper angle, cost, throughput, etc. are sensitive to the process parameters of the etch process.

Passivation layer, 316, is formed above source and drain electrodes, 312 and 314. The passivation layer, 316, is typically formed by a deposition process followed by a patterning process. Optionally, an anneal step is implemented prior to patterning, post patterning, or both. The passivation layer, 316, may be formed using deposition techniques such as PVD, ALD, or PECVD, or by wet coating techniques. The performance of the passivation layer can be sensitive to composition and process parameters. Examples of suitable materials for the passivation layer include silicon oxide and silicon nitride, a stack of silicon nitride and silicon oxide, a mixture, multi-layer, or combination thereof of a high bandgap (e.g. silicon oxide, or aluminum oxide) and high-k dielectric material (e.g. hafnium oxide, zirconium oxide, titanium oxide), a high bandgap material (e.g. silicon oxide, or aluminum oxide) or high-k dielectric material (e.g. hafnium oxide, zirconium oxide, titanium oxide). The passivation layer, 116, may be patterned using either wet techniques such as chemical etching, or dry techniques such as RIE. In both of these techniques, parameters such as the uniformity, etch rate, selectivity, critical dimension loss, taper angle, cost, throughput, etc. are sensitive to the process parameters of the etch process.

In some embodiments, between one or more of the deposition and patterning steps discussed previously (e.g. the formation of the gate electrode layer, the gate dielectric layer, the metal-based semiconductor layer, the source/drain electrode layers, or the passivation layer), the surface of the deposited film may be subjected to a treatment process before or after the patterning step. Examples of treatment processes include degas steps to remove adsorbed moisture due to exposure to ambient, anneal treatments, surface cleaning treatments (either wet or dry), and plasma treatments (e.g. exposure to plasma generated species of Ar, $H_2$, $N_2$, $N_2O$, $O_2$, $O_3$, etc.).

FIG. 4 is a flow chart illustrating the steps of a method according to some embodiments. Those skilled in the art will understand that the sequence of steps listed in FIG. 4 is just an example and that other sequences that include other steps or exclude some of these steps are also within the scope of the present disclosure. In step 402, a gate electrode layer is deposited above the substrate. Typically, the gate electrode is a material with high conductivity such as a metal, metal alloy, or conductive compound (e.g. titanium nitride, tantalum nitride, and the like). Examples of suitable materials for the gate electrode include a stack of Cu and a Cu-alloy, a stack of Cu and Mo, a stack of Cu and Ti, a stack of Cu and Mo—Ti alloy, a stack of Cu and Mo—Ta alloy, Cu, Mo, Al, a stack of Al and Mo, a stack of Al and Ti, or a stack of Al and Mo—Ti alloy. It should be noted that Al can contain a small concentration of Neodymium (Nd). It should be understood that the Cu in the Cu stacks, and Al in the Al stacks are thicker than the adjacent layers (e.g. Cu-alloy, or Mo—Ti alloy). Furthermore, the stacks can be a bi-layer of Cu and Cu-alloy, or a tri-layer of Cu-alloy/Cu/Cu-alloy, or Mo/Al/Mo. Typical Cu-alloys include Cu—Mg—Al, and Cu—Mn, wherein the Cu-alloys can also contain small concentrations of phosphides, Mg, or Ca. For some transparent TFTs, the gate electrode consists of a transparent conductive oxide, (e.g. In—Sn—O (ITO), In—Zn—O (IZO)), and related materials. The performance of the gate electrode can be sensitive to composition and process parameters. The same holds for the diffusion barrier layer underneath the gate electrode. The gate electrode layer can be deposited using well known deposition techniques such as PVD, CVD, PECVD, PLD, evaporation, etc.

In step 404, the gate electrode layer is patterned. The gate electrode layer is patterned using known photolithography techniques followed by etching the gate electrode layer using wet and/or dry etching processes. In some embodiments, the gate electrode layer is etched using a combination of wet and dry etching processes. Examples of wet etching processes include the application of acidic, basic, or organic-solvent based solutions (depending on the material to be etched) to the gate electrode layer. Examples of dry etching processes include reactive ion etching (RIE), plasma etching, ion milling, and the like.

In step 406, a gate dielectric layer is deposited above the gate electrode layer. Typically, the gate dielectric is an insulating material such as a silicon oxide, silicon nitride, or a metal oxide such as aluminum oxide, and the like. Examples of suitable materials for the gate dielectric include silicon oxide and silicon nitride, a stack of silicon nitride and silicon oxide, a mixture, multi-layer, or combination thereof of a high bandgap (e.g. silicon oxide, or aluminum oxide) and high-k dielectric material (e.g. hafnium oxide, zirconium oxide, titanium oxide), a high bandgap material (e.g. silicon oxide, or aluminum oxide) or high-k dielectric material (e.g. hafnium oxide, zirconium oxide, titanium oxide). In some embodiments, the deposition process is a vacuum-based process such as PVD, ALD, PE-ALD, AVD, UV-ALD, CVD, PECVD, PLD, or evaporation. In some embodiments, the deposition process is a solution-based process such as printing or spraying of inks, screen printing, inkjet printing, slot die coating, gravure printing, wet chemical depositions, or from sol-gel methods, such as the coating, drying, and firing of polysilazanes. Furthermore, the substrates may be processed in many configurations such as single substrate processing, multiple substrate batch processing, in-line continuous processing, in-line "stop and soak" processing, or roll-to-roll processing.

In step 408, the gate dielectric layer is patterned. Optionally, an anneal step is implemented prior to patterning, post patterning, or both. The gate dielectric layer is patterned using known photolithography techniques followed by etching the gate dielectric layer using wet and/or dry etching processes. In some embodiments, the gate dielectric layer is etched using a combination of wet and dry etching processes. Examples of wet etching processes include the application of acidic, basic, or organic-solvent based solutions (depending on the material to be etched) to the gate dielectric layer. Examples of dry etching processes include reactive ion etching (RIE), plasma etching, ion milling, and the like.

In step 410, a metal-based semiconductor layer is deposited above the gate dielectric layer. Examples of suitable materials for the semiconductor layer include indium gallium zinc oxide (In—Ga—Zn—O or IGZO), amorphous silicon, low-temperature polysilicon, In—Zn—O (IZO), Zn—Sn—O (ZTO), Hf—In—Zn—O (HIZO), and Al—Zn—Sn—O (AZTO), oxy-nitrides such as Zn—O—N (ZnON), In—O—N (InON), Sn—O—N (SnON), c-axis aligned crystalline (CAAC) materials such as CAAC-IGZO, or polycrystalline materials such as ZnO or In—Ga—O (IGO). Indium in these materials might be partially or completely replaced by Sn, or Sb. Gallium in these materials might be partially or completely replaced by one or more of Al, Hf, In, Nb, Si, Sn, Ta, Ti, Zn, or Zr. Oxygen in these materials might be partially or completely replaced by one or more of C, N, P, S, Se, Si, or Te. Other potential candidates as active channel (semiconductor) materials are refractory metal chalcogenides, (e.g. molybdenum sulfides). It should be noted that it is possible to deposit a bi-, or tri-layer, where each layer has a composition optimized for its functionality, the latter being contact layer with the gate insulator, bulk active channel layer, and contact layer with the source and drain electrodes and etch stopper or passivation layers. Furthermore, the active (semiconducting) channel layer might have a continuous change in composition (e.g. a gradient) through the thickness of the film. Common extrinsic (n-type) dopants for ZnO-based semiconductors are Al, B, Cr, Ga, H, In and Li. Furthermore, the metal cations in IGZO may be partially or completely replaced by Ag, As, Au, Bi, Cd, Cu, Zn, Ga, Ge, Hg, In, Pb, Sb, Sn, and Tl. Other dopants of interest include halogens like Cl and F. In some embodiments, the deposition process is a vacuum-based process such as PVD, ALD, PE-ALD, AVD, UV-ALD, CVD, PECVD, or evaporation. In some embodiments, the deposition process is a solution-based process such as printing or spraying of inks, screen printing, inkjet printing, slot die coating, gravure printing, wet chemical depositions, or from sol-gel methods. Furthermore, the substrates may be processed in many configurations such as single substrate processing, multiple substrate batch processing, in-line continuous processing, in-line "stop and soak" processing, or roll-to-roll processing.

In step 412, the metal-based semiconductor layer is patterned. Optionally, an anneal step is implemented prior to patterning, post patterning, or both. The anneal step may occur just below atmospheric pressure, at atmospheric pressure, or slightly above atmospheric pressure. Typical anneal ambient atmospheres contain at least one of oxygen, ozone, water, hydrogen, nitrogen, argon, or a combination thereof. In addition, the semiconductor layer may be treated prior to etch stopper or source/drain deposition with a plasma containing $O_2$ or $N_2O$. The metal-based semiconductor layer is patterned using known photolithography techniques followed by etching the metal-based semiconductor layer using wet and/or dry etching processes. In some embodiments, the metal-based semiconductor layer is etched using a combination of wet and dry etching processes. Examples of wet etching processes include the application of acidic, basic, or organic-solvent based solutions (depending on the material to be etched) to the metal-based semiconductor layer. Examples of dry etching processes include reactive ion etching (RIE), plasma etching, ion milling, and the like.

In some embodiments the metal-based semiconductor is optionally annealed either after deposition or after patterning (not shown). The annealing serves to control doping in the metal-based semiconductor, or passivate defects in or near the metal-based semiconductor that may have been formed during any of the deposition and/or patterning/etching steps. The anneal step may occur just below atmospheric pressure, at atmospheric pressure, or slightly above atmospheric pressure. Typical anneal ambient atmospheres contain at least one of oxygen, ozone, water, hydrogen, nitrogen, argon, or a combination thereof. The annealing is typically performed in a temperature range between 200 C and 400 C for times between 15 minutes and 90 minutes.

In step 414, a source/drain electrode layer is deposited above the metal-based semiconductor layer. The source and drain electrodes are typically deposited as a single layer or a stack of two to three layers, and then defined during the patterning step. Typically, the source/drain electrode is a material with high conductivity such as a metal, metal alloy, or conductive compound (e.g. titanium nitride, tantalum nitride, and the like). Examples of suitable materials for the source/drain electrode include a stack of Cu and a Cu-alloy, a stack of Cu and Mo, a stack of Cu and Ti, a stack of Cu and Mo—Ti alloy, a stack of Cu and Mo—Ta alloy, Cu, Mo, Al, a stack of Al and Mo, a stack of Al and Ti, or a stack of Al and Mo—Ti alloy. It should be noted that Al can contain a small concentration of Neodymium (Nd). It should be understood that the Cu in the Cu stacks, and Al in the Al stacks are thicker than the adjacent layers (e.g. Cu-alloy, or Mo—Ti alloy). Furthermore, the stacks can be a bi-layer of Cu and Cu-alloy, or a tri-layer of Cu-alloy/Cu/Cu-alloy, or Mo/Al/Mo. Typical Cu-alloys include Cu—Mg—Al, and Cu—Mn, wherein the Cu-alloys can also contain small concentrations of phosphides, Mg, or Ca. For some transparent TFTs, the source and drain electrodes consist of a transparent conductive oxide, (e.g. In—Sn—O (ITO), In—Zn—O (IZO)), and related materials. The source/drain electrode layer can be deposited using well known deposition techniques such as PVD, CVD, PECVD, PLD, evaporation, etc.

In step 416, the source/drain electrode layer is patterned into individual source and drain electrodes. Optionally, an anneal step is implemented prior to patterning, post patterning, or both. The source/drain electrode layer is patterned using known photolithography techniques followed by etching the source/drain electrode layer using wet and/or dry etching processes. In some embodiments, the source/drain electrode layer is etched using a combination of wet and dry etching processes. Examples of wet etching processes include the application of acidic, basic, or organic-solvent based solutions (depending on the material to be etched) to the source/drain electrode layer. Wet etch chemistries are most commonly aqueous, and for acidic wet etch formulations include a mixture of inorganic acids, optionally organic acids, and optionally an oxidizer like hydrogen peroxide, or nitric acid, and optionally other chemicals, either as stabilizers, to control critical dimension loss, taper angle, or etch selectivity. Examples of dry etching processes include reactive ion etching (RIE), plasma etching, ion milling, and the like. The performance of the source and drain electrodes can be sensitive to composition and process parameters.

In step 418, optionally, a thin layer of the active channel of the metal-based semiconductor layer is removed after the patterning of the source/drain layer to remove damage introduced during processing. Alternatively, this thin layer is not removed, yet converted to undamaged material. Furthermore, a combination of a removal and conversion step can be used as well.

In step 420, a passivation layer is deposited above the source/drain layer to form a TFT stack. Typically, the passivation layer is an insulating material such as a silicon oxide, silicon nitride, or a metal oxide such as aluminum oxide, and the like. Examples of suitable materials for the passivation layer include silicon oxide and silicon nitride, a stack of silicon nitride and silicon oxide, a mixture, multi-layer, or combination thereof of a high bandgap (e.g. silicon oxide, or aluminum oxide) and high-k dielectric material (e.g. hafnium oxide, zirconium oxide, titanium oxide), a high bandgap material (e.g. silicon oxide, or aluminum oxide) or high-k dielectric material (e.g. hafnium oxide, zirconium oxide, titanium oxide). The passivation layer can be deposited using well known deposition techniques such as PVD, CVD, PECVD, PLD, evaporation, etc. Typically, the passivation layer is patterned.

In step 422, the TFT stack is annealed. The annealing serves to reduce (contact) resistance, control doping in the semiconductor, or passivate defects in or near the semiconductor that may have been formed during any of the deposition and/or patterning/etching steps. The anneal step may occur just below atmospheric pressure, at atmospheric pressure, or slightly above atmospheric pressure. Typical anneal ambient atmospheres contain at least one of oxygen, ozone, water, hydrogen, nitrogen, argon, or a combination thereof. The annealing is typically performed in a temperature range between 200 C and 400 C for times between 15 minutes and 90 minutes.

In some embodiments, between one or more of the deposition and patterning steps discussed previously (e.g. the formation of the gate electrode layer, the gate dielectric layer, the metal-based semiconductor layer, the source/drain electrode layers, or the passivation layer), the surface of the deposited film may be subjected to a treatment process before or after the patterning step. Examples of treatment processes include degas steps to remove adsorbed moisture due to exposure to ambient, anneal treatments, surface cleaning treatments (either wet or dry), and plasma treatments (e.g. exposure to plasma generated species of Ar, $H_2$, $N_2$, $N_2O$, $O_2$, $O_3$, etc.).

The performance of the metal-based semiconductor layer will be sensitive to parameters such as composition, crystal structure, oxygen vacancies, hydrogen concentration, surface defects, interface state density, and the like. Many of these parameters will be influenced by the processing of the material and the process conditions to which the material is exposed. As an example, in the method as outlined in FIG. 4, the metal-based semiconductor material is exposed to air (after deposition), photoresist and photoresist developer (during patterning), etch chemistries (either wet, dry, or both), processing conditions related to the deposition of the source/drain layer (e.g. elevated temperatures, plasma bombardment, etc.), and processing conditions related to the patterning of the source/drain layer (either wet, dry, or both). Those skilled in the art will understand that the active channel of the metal-based semiconductor layer is exposed to all of these processing conditions. As discussed previously, typically, a thin layer of the active channel of the metal-based semiconductor layer is removed or converted after the patterning of the source/drain layer to remove damage introduced during processing.

In some embodiments, the metal-based semiconductor layer is based on an IGZO material. Some of these materials exhibit stable amorphous phases, high mobility (e.g. >5 cm$^2$/Vs), low threshold voltage (close to zero, e.g. in a range of −1.0V to +2.0V), low carrier concentrations (e.g. $10^{16}$-$10^{17}$ cm$^{-3}$), high ON/OFF current ratios (e.g. >$10^6$), and high durability (e.g. negative bias temperature illumination stress NBTIS with threshold voltage shift in a range of −1.5V to +0.5V). However, since these materials are multinary compounds (e.g. three or more elements), their performance and properties are sensitive to factors such as composition, concentration gradients, deposition parameters, post-deposition treatments, interactions with adjacent materials, and the like.

In some embodiments, wet etch formulations are disclosed that exhibit good selectivity for etching the etch stop layer over the metal-based semiconductor layer. As discussed previously with respect to the structure illustrated in FIG. 1 and step 216 in FIG. 2, the etch stop layer can be etched using wet or dry processes, but is typically etched using dry processes such as RIE. RIE is capital intensive, and therefore, not preferred. If a wet etch process is to be used in step 216, it preferably has a selectivity of between 2-25, even more preferred higher than 10, even more preferred higher than 25, for etching the etch stop layer compared to the underlying metal-based semiconductor layer. As discussed previously, examples of suitable materials for the etch stopper include silicon oxide, silicon nitride, a stack of silicon nitride and silicon oxide, a mixture, multi-layer, or combination thereof of a high bandgap material (e.g. silicon oxide, or aluminum oxide) and high-k dielectric material (e.g. hafnium oxide, zirconium oxide, titanium oxide), a high bandgap (e.g. silicon oxide, or aluminum oxide) or high-k dielectric material (e.g. hafnium oxide, zirconium oxide, titanium oxide). In addition to these inorganic materials, various organic materials may be used as etch stopper materials as well. Examples of organic etch stopper materials include photoresist, organic polymers, UV-curable polymers, and heat-curable polymers.

Metal-based semiconductor layers such as IGZO will dissolve (i.e. etch) in acidic solutions where the pH is less than about 3.0 (e.g. by forming soluble $Zn^{2+}$, $In^{3+}$, and $Ga^{3+}$ species). In some embodiments, the metal-based semiconductor material further includes at least one of Al, Hf, N, S, Se, Si, Sn, Te, or Zr. Further, these layers will also dissolve in basic solutions where the pH is greater than about 12.0 (e.g. by forming soluble $ZnO_2^{2-}$, $InO_2^{1-}$, and $GaO_3^{2-}$, species). Therefore, the IGZO can be protected from etching in the pH range between 3.0 and 12.0 by selecting etching formulations that produce slower dissolution within this pH range compared to the material on top of the IGZO (e.g. etch stopper or source and drain). Etching of the IGZO material can be further retarded by saturating the wet etch solution with poorly soluble salts of the IGZO components (e.g. salts of In, Ga, and Zn) to the formulation. Principles of equilibrium chemistry will discourage the etching of the IGZO material (e.g., the etching rate of the metal-based semiconductor will be reduced).

In some embodiments, etch stop layers are selectively etched over a metal-based semiconductor layer during the manufacture of TFT display devices. The selective etch formulations include at least one or more of the following components for the selective etch of silicon oxide, silicon nitride, silicon oxy nitride, or silicon oxy nitride based etch stop layers over the metal-based semiconductor layer: an acid solution with a pH below 7.0, preferably in the range of 1.0 to 7.0, and even more preferred in the range of 3.0 to 7.0, pH buffer components to stabilize the pH (e.g. citric acid/sodium citrate, acetic acid/sodium acetate, or buffered oxide etch, being a mixture of $NH_4F$ and HF), fluoride-containing components (e.g. HF) to facilitate the etching of the etch stop material, selective complexing agents for $[SiF_6]^{2-}$ (e.g. cyclic compounds based on quarternary ammonium cations), surfactants bonding to the metal-based semiconductor surface preferentially over the etch stopper surface, and salts of the metals in the metal-based semiconductor with a low solubility (e.g. salts of In, Ga, and Zn in case of IGZO semiconductor, such as fluorides, carbonates, phosphates, borates, arsenates, arsenites, cyanides, ferricyanides, oxalates, sulfites, sulfides, chromates, and silicates) to retard the etching of the metal-based semiconductor material. The salts of the metals in the metal-based semiconductor can be present in a concentration that is within about 10% of the solubility limit within the formulation. The pH can be adjusted by using one or a mixture of more acids like hydrofluoric acid (HF) and other typical acids (e.g. hydrochloric acid (HCl), hydrobromic acid (HBr), sulfuric acid ($H_2SO_4$), nitric acid ($HNO_3$), phosphoric acid ($H_3PO_4$), organic acids, etc.). The fluoride-containing components can be introduced from HF or from soluble fluoride-containing reagents. This formulation will be effective at removing the etch stop layer and will effectively stop on the metal-based semiconductor material. Further, the etch formulation will not cause significant damage to the metal-based semiconductor material that cannot be repaired. Minor damage to the metal-based semiconductor layer can be recovered by a subsequent wet or dry surface treatment.

In some embodiments, wet etch formulations are disclosed that exhibit good selectivity for etching the source/drain electrode layer over the metal-based semiconductor layer. If the source/drain electrode layer can be etched without unacceptable damage to the underlying gate dielectric, it may obviate the need to deposit and pattern an etch-stop layer. As discussed previously with respect to the structure illustrated in FIG. 3 and step 416 in FIG. 4, the source/drain electrode stop layer can be etched using wet or dry processes. There is a need to find a low cost wet etch formulation with a high etch selectivity of the source and drain electrodes over the metal-based semiconductor layer without excessive damage to the bulk of the metal-based semiconductor layer. If a wet etch process is to be used in step 416, it preferably has a selectivity of between 2-25, even more preferred higher than 10, even more preferred higher than 25, for etching the etch stop layer compared to the underlying metal-based semiconductor layer. As discussed previously, Examples of suitable materials for the source/drain electrode include a stack of Cu and a Cu-alloy, a stack of Cu and Mo, a stack of Cu and Ti, a stack of Cu and Mo—Ti alloy, a stack of Cu and Mo—Ta alloy, Cu, Mo, Al, a stack of Al and Mo, a stack of Al and Ti, or a stack of Al and Mo—Ti alloy. It should be noted that Al can contain a small concentration of Neodymium (Nd). It should be understood that the Cu in the Cu stacks, and Al in the Al stacks are thicker than the adjacent layers (e.g. Cu-alloy, or Mo—Ti alloy). Furthermore, the stacks can be a bi-layer of Cu and Cu-alloy, or a tri-layer of Cu-alloy/Cu/Cu-alloy, or Mo/Al/Mo. Typical Cu-alloys include Cu—Mg—Al, and Cu—Mn, wherein the Cu-alloys can also contain small concentrations of phosphides, Mg, or Ca. For some transparent TFTs, the source and drain electrodes consist of a transparent conductive oxide, (e.g. In—Sn—O (ITO), In—Zn—O (IZO)), and related materials.

Metal-based semiconductor layers such as IGZO will dissolve (i.e. etch) in acidic solutions where the pH is less than about 3.0 (e.g. by forming soluble $Zn^{2+}$, $In^{3+}$, and $Ga^{3+}$ species). In some embodiments, the metal-based semiconductor material further includes at least one of Al, Hf, N, S, Se, Si, Sn, Te, or Zr. Further, these layers will also dissolve in basic solutions where the pH is greater than about 12.0 (e.g. by forming soluble $ZnO_2^{2-}$, $InO_2^{1-}$, and $GaO_3^{2-}$, species). Therefore, the IGZO can be protected from etching in the pH range between 3.0 and 12.0 by selecting etching formulations that produce slower dissolution within this pH range compared to the material on top of the IGZO (e.g. etch stopper or source and drain). Etching of the IGZO material can be further retarded by saturating the wet etch solution with poorly soluble salts of the IGZO components (e.g. salts of In, Ga, and Zn) to the formulation. Principles of equilibrium chemistry will discourage the etching of the IGZO material (e.g., the etching rate of the metal-based semiconductor will be reduced). The salts of the metals in the metal-based semiconductor can be present in a concentration that is within about 10% of the solubility limit within the formulation.

In some embodiments, molybdenum-based source/drain electrode layers are selectively etched over a metal-based semiconductor layer during the manufacture of TFT display devices. The wet etch formulations will include at least one or more of the following components: an alkaline solution with a pH in the range of 7.0 to 12.0, pH buffer components to stabilize the pH of the formulation (e.g. sodium carbonate/sodium hydrogen carbonate, or buffers based on borates, or based on N-Cyclohexyl-2-aminoethanesulfonic acid, or buffers based on sodium hydroxide mixed with either sodium tetraborate, glycine, sodium bicarbonate, or sodium hydrogen orthophosphate), oxidizing components to facilitate the etching of the molybdenum-based source/drain electrode material (e.g. peroxides like hydrogen peroxide, or oxidizers like chlorates, perchlorates, and hexavalent chromium compounds), complexing agents that preferentially complex molybdenum-based ions over the metal-based ions of the metal-based semiconductor (e.g. cyclic compounds like crown ethers), surfactants bonding to the metal-based semiconductor surface preferentially over the source/drain electrode material, and salts of the metals of the metal-based semiconductor material with a low solubility (e.g. salts of In, Ga, and Zn in case of IGZO semiconductor, such as fluorides, carbonates, phosphates, borates, arsenates, arsenites, cyanides, ferricyanides, oxalates, sulfites, sulfides, chromates, and silicates) to retard the etching of the metal-based semiconductor material. The salts of the metals in the metal-based semiconductor can be present in a concentration that is within about 10% of the solubility limit within the formulation. The pH can be adjusted by using one or a mixture of more bases. Further, the etch formulation will not cause significant damage to the metal-based semiconductor material that cannot be repaired. Minor damage to the metal-based semiconductor layer can be recovered by a subsequent wet or dry surface treatment. One example of a wet etch formulation is an alkaline mixture of $NH_4OH$ and hydrogen peroxide.

FIG. 5 is a table listing some candidate etch formulations for Mo-based source/drain electrode layers and corresponding etch rate data. Formulations with ID numbers 1, 3, and 4 illustrate acidic formulations wherein the pH is low (e.g. less than about 1). The measured etch rate data indicate that the etch rates for the molybdenum-based source/drain electrode materials are reasonable and range between about 17 Ns to about 45 Ns. However, the data also indicate that the etch rates for the IGZO are also high and ranges from about 70 Ns to about 160 A/s. These formulations would be unacceptable as a selective etch for removing the molybdenum-based source/drain electrode materials.

The formulation with ID number 2 illustrates an example of a selective etch for removing the molybdenum-based source/drain electrode materials formed above a metal-based semiconductor layer. The measured etch rate data indicates that the etch rate for the molybdenum-based source/drain electrode materials is reasonable at about 67 Ns. The data also indicate that the measured etch rates for the IGZO in this formulation is 0 Ns. Therefore, the molybdenum-based source/drain electrode materials could be etched without removing and/or damaging the underlying metal-based semiconductor layer using formulations similar to ID number 2.

As discussed previously, alternative materials for use in the source/drain electrode layers are based on copper and/or copper alloys. The lower resistivity of the copper will result in improved device performance.

In some embodiments, wet etch formulations are disclosed that exhibit good selectivity for etching the source/drain electrode layer over the metal-based semiconductor layer. If the source/drain electrode layer can be etched without unacceptable damage to the underlying metal-based semiconductor, it may obviate the need to deposit and pattern an etch-stop layer. As discussed previously with respect to the structure illustrated in FIG. 3 and step 416 in FIG. 4, the source/drain electrode stop layer can be etched using wet or dry processes. There is a need to find a low cost wet etch formulation with a high etch selectivity of the source and drain electrodes over the metal-based semiconductor layer without excessive damage to the bulk of the metal-based semiconductor layer. If a wet etch process is to be used in step 416, it preferably has a selectivity of between 2-25, even more preferred higher than 10, even more preferred higher than 25, for etching the etch stop layer compared to the underlying metal-based semiconductor layer.

Metal-based semiconductor layers such as IGZO will dissolve (i.e. etch) in acidic solutions where the pH is less than about 3.0 (e.g. by forming soluble $Zn^{2+}$, $In^{3+}$, and $Ga^{3+}$ species). In some embodiments, the metal-based semiconductor material further includes at least one of Al, Hf, N, S, Se, Si, Sn, Te, or Zr. Further, these layers will also dissolve in basic solutions where the pH is greater than about 12.0 (e.g. by forming soluble $ZnO_2^{2-}$, $InO_2^{1-}$, and $GaO_3^{2-}$ species). Therefore, the IGZO can be protected from etching in the pH range between 3.0 and 12.0 by selecting etching formulations that produce slower dissolution within this pH range compared to the material on top of the IGZO (e.g. etch stopper or source and drain). Etching of the IGZO material can be further retarded by saturating the wet etch solution with poorly soluble salts of the IGZO components (e.g. salts of In, Ga, and Zn) to the formulation. Principles of equilibrium chemistry will discourage the etching of the IGZO material (e.g., the etching rate of the metal-based semiconductor will be reduced). The salts of the metals in the metal-based semiconductor can be present in a concentration that is within about 10% of the solubility limit within the formulation.

In some embodiments, copper-based source/drain electrode layers are selectively etched over a metal-based semiconductor layer during the manufacture of TFT display devices. The wet etch formulations will include at least one or more of the following components: an acidic solution with a pH below 7.0, preferably in the range of 1.0 to 7.0, pH buffer components to stabilize the pH of the formulation (e.g. citric acid/sodium citrate, acetic acid/sodium acetate, or buffered oxide etch, being a mixture of $NH_4F$ and HF), complexing (chelating) agents that preferentially complex copper-based ions over the metal-based ions of the metal-based semiconductor (e.g.cyclic compounds like crown ethers, or compounds like lactic acid, citric acid, formic acid, tartaric acid, malonic acid, and phosponate compounds like etidronic acid, 1,2-diaminoethanetetrakismethylene phosphonic acid, nitrilotrismethylenephosphonic acid, or diethylenetriaminepentakismethylene phosphonic acid), surfactants bonding to the metal-based semiconductor surface preferentially over the source/drain electrode material, and salts of the metals of the metal-based semiconductor material components with a low solubility (e.g. salts of In, Ga, and Zn in case of IGZO semiconductor, such as fluorides, carbonates, phosphates, borates, arsenates, arsenites, cyanides, ferricyanides, oxalates, sulfites, sulfides, chromates, and silicates) to retard the etching of the metal-based semiconductor material. The salts of the metals in the metal-based semiconductor can be present in a concentration that is within about 10% of the solubility limit within the formulation. The pH can be adjusted by using one or a mixture of more acids like organic acids (e.g. lactic acid, citric acid, formic acid, tartaric acid, malonic acid, and phosponate compounds like etidronic acid, 1,2-diaminoethanetetrakismethylene phosphonic acid, nitrilotrismethylenephosphonic acid, or diethylenetriaminepentakismethylene phosphonic acid), or inorganic acids (e.g. hydrochloric acid (HCl), hydrobromic acid (HBr), sulfuric acid ($H_2SO_4$), nitric acid ($HNO_3$), phosphoric acid ($H_3PO_4$), etc.). Further, the etch formulation will not cause significant damage to the metal-based semiconductor material that cannot be repaired. Minor damage to the metal-based semiconductor layer can be recovered by a subsequent wet or dry surface treatment. One example of a wet etch formulation is a mixture of hydrogen peroxide with formic acid. Another example of a wet etch formulation is a mixture of hydrogen peroxide with lactic acid. Yet, another example of a wet etch formulation is a mixture of hydrogen peroxide with citric acid. Yet, another example of a wet etch formulation is a mixture of hydrogen peroxide with etidronic acid. Yet, another example of a wet etch formulation is a mixture of hydrogen peroxide with nitrilotrismethylenephosphonic acid.

Although the foregoing examples have been described in some detail for purposes of clarity of understanding, the invention is not limited to the details provided. There are many alternative ways of implementing the invention. The disclosed examples are illustrative and not restrictive.

What is claimed:

1. A formulation for etching a layer formed above a semiconductor layer, the formulation comprising:
   an aqueous acid solution, wherein a pH of the aqueous acid solution is between about 1.0 and about 7.0;
   buffer components;
   fluorine-containing components; and
   salts of metal elements;
   wherein the semiconductor layer is a metal-based semiconductor layer;
   wherein a metal element of the salts is a same metal as a metal in the metal-based semiconductor layer;
   wherein a concentration of the salts in the formulation is within about 10% of the solubility limit of the salts in the formulation.

2. The formulation of claim 1 wherein the metal-based semiconductor layer comprises indium, gallium, zinc, and oxygen.

3. The formulation of claim 1 wherein the metal-based semiconductor layer further comprises oxygen and at least one of Al, Hf, N, S, Se, Si, Sn, Te, or Zr.

4. The formulation of claim 1 wherein the aqueous acid solution comprises HF.

5. The formulation of claim 4 wherein the aqueous acid solution further comprises at least one of HCl, HBr, $H_2SO_4$, $HNO_3$, $H_3PO_4$, or organic acids.

6. The formulation of claim 1 wherein the layer comprises one of silicon oxide, silicon nitride, silicon oxynitride, or a stack of silicon oxide and silicon nitride.

7. The formulation of claim 1 wherein the buffer components comprise at least one of citric acid/sodium citrate, acetic acid/sodium acetate, buffered oxide etch, or a mixture of $NH_4F$ and HF.

8. The formulation of claim 1 wherein the salts of the metal elements comprise at least one of fluorides, carbonates, phosphates, borates, arsenates, arsenites, cyanides, ferricyanides, oxalates, sulfites, sulfides, chromates, or silicates.

9. The formulation of claim 1 wherein the fluorine-containing components comprise at least one of HF or a soluble fluoride-containing reagent.

10. The formulation of claim 1 wherein a selectivity of an etch rate of the layer to an etch rate of the metal-based semiconductor layer is in a range between 2 and 25.

11. A formulation for etching a metal layer formed above a metal-based semiconductor layer, the formulation comprising:
an aqueous acid solution, wherein a pH of the aqueous acid solution is between about 1.0 and about 7.0;
buffer components; and
salts of metal elements;
wherein the semiconductor layer is a metal-based semiconductor layer;
wherein a metal element of the salts is a same metal as a metal in the metal-based semiconductor layer;
wherein a concentration of the salts in the formulation is within about 10% of the solubility limit of the salts in the formulation.

12. The formulation of claim 11 wherein the metal-based semiconductor layer comprises indium, gallium, zinc, and oxygen.

13. The formulation of claim 11 wherein the metal-based semiconductor layer further comprises oxygen and at least one of Al, Hf, N, S, Se, Si, Sn, Te, or Zr.

14. The formulation of claim 11 wherein an acid in the aqueous acid solution comprises at least one of lactic acid, citric acid, formic acid, tartaric acid, malonic acid, etidronic acid, 1,2-diaminoethanetetrakismethylene phosphonic acid, nitrilotrismethylenephosphonic acid, or diethylenetriaminepentakismethylene phosphonic acid.

15. The formulation of claim 14 wherein the aqueous acidic solution further comprises $H_2O_2$.

16. The formulation of claim 11 wherein the source/drain layer comprises copper-based materials.

17. The formulation of claim 11 wherein the buffer components comprise at least one of citric acid/sodium citrate, acetic acid/sodium acetate, buffered oxide etch, or a mixture of $NH_4F$ and HF.

18. The formulation of claim 11 wherein the salts of the metal elements comprise at least one of fluorides, carbonates, phosphates, borates, arsenates, arsenites, cyanides, ferricyanides, oxalates, sulfites, sulfides, chromates, or silicates.

19. The formulation of claim 1 wherein a selectivity of an etch rate of the layer to an etch rate of the metal-based semiconductor layer is in a range between 2 and 25.

* * * * *